US 12,525,189 B2

(12) United States Patent
Lee et al.

(10) Patent No.: US 12,525,189 B2
(45) Date of Patent: Jan. 13, 2026

(54) DISPLAY APPARATUS AND DRIVING METHOD OF PIXEL

(71) Applicant: Samsung Display Co., Ltd., Yongin-si (KR)

(72) Inventors: Jaehoon Lee, Yongin-si (KR); Jihyun Ka, Yongin-si (KR); Seokje Seong, Yongin-si (KR); Joosun Yoon, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 19/022,475

(22) Filed: Jan. 15, 2025

(65) Prior Publication Data

US 2025/0157405 A1     May 15, 2025

Related U.S. Application Data

(63) Continuation of application No. 18/435,919, filed on Feb. 7, 2024, now Pat. No. 12,217,684.

(30) Foreign Application Priority Data

Feb. 8, 2023   (KR) .................. 10-2023-0016994
Apr. 5, 2023   (KR) .................. 10-2023-0044792

(51) Int. Cl.
*G09G 3/3233*     (2016.01)

(52) U.S. Cl.
CPC ... *G09G 3/3233* (2013.01); *G09G 2300/0452* (2013.01); *G09G 2300/0819* (2013.01); *G09G 2300/0852* (2013.01); *G09G 2300/0861* (2013.01); *G09G 2310/08* (2013.01); *G09G 2320/02* (2013.01); *G09G 2330/021* (2013.01); *G09G 2330/028* (2013.01)

(58) Field of Classification Search
None
See application file for complete search history.

(56) References Cited

U.S. PATENT DOCUMENTS

| 8,941,576 | B2 | 1/2015 | Kang et al. |
| 9,047,841 | B2 | 6/2015 | Song et al. |
| 9,203,395 | B2 | 12/2015 | Kim et al. |
| 9,355,741 | B2 | 5/2016 | Jeon et al. |

(Continued)

FOREIGN PATENT DOCUMENTS

| KR | 10-2017-0008348 | 1/2017 |
| KR | 10-1761355 | 7/2017 |

(Continued)

OTHER PUBLICATIONS

U.S. Appl. No. 18/435,919, filed Feb. 7, 2024.

*Primary Examiner* — Stephen T. Reed
(74) *Attorney, Agent, or Firm* — Harness, Dickey & Pierce, P.L.C.

(57) ABSTRACT

Provided are a pixel configured to receive a first initialization voltage during a first period between a writing period of a first scan period and a first emission period of a frame and to receive a second initialization voltage different from the first initialization voltage from a start time point of a second period before a second emission period of a second scan period subsequent to the first scan period, a display apparatus including the pixel, and a driving method of the display apparatus.

20 Claims, 27 Drawing Sheets

(56) References Cited

U.S. PATENT DOCUMENTS

| | | | |
|---|---|---|---|
| 10,127,877 B2 | 11/2018 | Park et al. | |
| 10,672,357 B2 | 6/2020 | Lee et al. | |
| 10,937,370 B2 * | 3/2021 | Son | G09G 3/2003 |
| 11,417,278 B2 * | 8/2022 | Ahn | G09G 3/3696 |
| 11,626,060 B2 | 4/2023 | Kim et al. | |
| 2021/0201798 A1 | 7/2021 | Kim et al. | |
| 2021/0390906 A1 | 12/2021 | Pyun et al. | |
| 2021/0407412 A1 | 12/2021 | Kim et al. | |
| 2022/0180812 A1 * | 6/2022 | Lin | H10D 30/6755 |
| 2022/0284865 A1 | 9/2022 | Lee et al. | |
| 2022/0358884 A1 | 11/2022 | Chae et al. | |

FOREIGN PATENT DOCUMENTS

| | | |
|---|---|---|
| KR | 10-2018-0049479 | 5/2018 |
| KR | 10-2005485 | 7/2019 |
| KR | 10-2034140 | 10/2019 |
| KR | 10-2085152 | 3/2020 |
| KR | 10-2020-0057204 | 5/2020 |
| KR | 10-2020-0135633 | 12/2020 |
| KR | 10-2021-0083644 | 7/2021 |
| KR | 10-2021-0085875 | 7/2021 |
| KR | 10-2021-0154297 | 12/2021 |
| KR | 10-2022-0002790 | 1/2022 |
| KR | 10-2022-0126323 | 9/2022 |
| KR | 10-2022-0152481 | 11/2022 |

\* cited by examiner

DISPLAY APPARATUS AND DRIVING METHOD OF PIXEL

CROSS-REFERENCE TO RELATED APPLICATIONS

This is a continuation application of U.S. patent application Ser. No. 18/435,919, filed Feb. 7, 2024 (now pending), the disclosure of which is incorporated herein by reference in its entirety. U.S. patent application Ser. No. 18/435,919 is based on and claims priority under 35 U.S.C. § 119 to Korean Patent Application Nos. 10-2023-0016994, filed Feb. 8, 2023, and 10-2023-0044792, filed Apr. 5, 2023, in the Korean Intellectual Property Office, the disclosures of which are incorporated by reference herein in their entirety.

BACKGROUND

1. Technical Field

One or more embodiments relate to a pixel and a display apparatus including the pixel.

2. Description of the Related Art

Recently, the use of display apparatuses has been diversifying. The reduction in thickness and weight of a display apparatus increases the range of use of the display apparatus.

As the display apparatus is variously used, various methods of designing the shape of the display apparatus can be provided. Also, functions capable of being connected or linked to the display apparatus are increasing.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The technical objectives to be achieved by the disclosure are not limited to those described herein, and other technical objectives that are not mentioned herein would be clearly understood by a person skilled in the art from the description of the disclosure.

One or more embodiments provide a display apparatus having improved display quality. However, this objective is merely illustrative, and the scope of the disclosure is not limited thereto.

Additional aspects will be set forth in part in the description which follows and, in part, will be apparent from the description, or may be learned by practice of the embodiments of the disclosure.

According to one aspect of the disclosure, a display includes a plurality of pixels, each of the plurality of pixels comprising: a light-emitting diode, a first transistor electrically connected to a driving voltage line and the light-emitting diode, a second transistor electrically connected to the first transistor and the light-emitting diode, and a third transistor electrically connected to the light-emitting diode and an initialization voltage line. The pixel may be configured to operate, during a frame, in a first scan period including a writing period for receiving a data signal and a first emission period for emitting light with luminance corresponding to the data signal and in a second scan period including a second emission period for maintaining the data signal and emitting light with luminance corresponding to the maintained data signal. A gate of the second transistor may be further configured to receive a first gate signal of a gate-on voltage during the second scan period. A gate of the third transistor may be configured to receive a second gate signal of a gate-on voltage in a first period before the second emission period of the second scan period. The initialization voltage line may be configured to receive a first initialization voltage during the first scan period, and to receive a second initialization voltage different from the first initialization voltage from a start time point of the first period of the second scan period.

The gate of the second transistor may be further configured to receive another first gate signal of a gate-on voltage and the gate of the third transistor may be configured to receive another second gate signal of a gate-on voltage, in a second period between the writing period and the first emission period.

The pixel may further include a fourth transistor electrically connected to a data line and a gate of the first transistor, and a gate of the fourth transistor may be further configured to receive a third gate signal of a gate-on voltage in the writing period.

The pixel may further include a fifth transistor electrically connected to the driving voltage line and the first transistor, and a sixth transistor electrically connected to the gate of the first transistor and a reference voltage line, wherein the gate of the second transistor may be configured to receive a first gate signal of a gate-off voltage, a gate of the fifth transistor may be configured to receive a fourth gate signal of a gate-on voltage, and a gate of the sixth transistor may be configured to receive a fifth gate signal of a gate-on voltage, in a third period before the writing period of the first scan period.

The gate of the fifth transistor may be configured to receive another fourth gate signal of a gate-on voltage during the second emission period and, the gate of the fifth transistor may be configured to receive a fourth gate signal of a gate-off voltage during a period except for the second emission period, in the second scan period.

The plurality of pixels may include a first pixel emitting light of a first color and a second pixel emitting light of a second color, and a second initialization voltage supplied to the first pixel and a second initialization voltage supplied to the second pixel may be different from each other.

The gate of the fifth transistor may be configured to receive a fourth gate signal of a gate-on voltage during the second scan period.

The plurality of pixels may include a first pixel emitting light of a first color and a second pixel emitting light of a second color, and a second initialization voltage supplied to the first pixel and a second initialization voltage supplied to the second pixel may be different from each other.

The display apparatus may further include a power supply circuit configured to output the first initialization voltage to the plurality of pixels during the first scan period and to output the second initialization voltage from a start time point of the first period of the second scan period.

According to another aspect of the disclosure, a display apparatus includes a plurality of pixels, each of the plurality of pixels comprising a light-emitting diode, a first transistor electrically connected to a driving voltage line and the light-emitting diode, a second transistor electrically connected to the first transistor and the light-emitting diode, and a third transistor electrically connected to the light-emitting diode and an initialization voltage line. The pixel may be configured to operate, during a frame, in a first scan period including a writing period for receiving a data signal and a first emission period for emitting light with luminance corresponding to the data signal and in a second scan period including a second emission period for maintaining the data signal and emitting light with luminance corresponding to the maintained data signal. A gate of the second transistor may be configured to receive a first gate signal of a gate-on voltage during the second scan period. The initialization voltage line may be configured to receive a first initialization voltage until before the first emission period of the first scan period, and to receive a second initialization voltage different from the first initialization voltage during the first emission period of the first scan period and the second scan period.

The gate of the second transistor may be configured to receive another first gate signal of a gate-on voltage and a gate of the third transistor may be configured to receive a second gate signal of a gate-on voltage, in a first period between the writing period and the first emission period.

The pixel may further include a fourth transistor electrically connected to a data line and a gate of the first transistor, and a gate of the fourth transistor may be configured to receive a third gate signal of a gate-on voltage in the writing period.

The pixel may further include a fifth transistor electrically connected to the driving voltage line and the first transistor, and a sixth transistor electrically connected to the gate of the first transistor and a reference voltage line, wherein the gate of the second transistor may be configured to receive a first gate signal of a gate-off voltage, a gate of the fifth transistor may be configured to receive a fourth gate signal of a gate-on voltage, and a gate of the sixth transistor may be configured to receive a fifth gate signal of a gate-on voltage, in a second period before the writing period of the first scan period.

The gate of the fifth transistor may be configured to receive a fourth gate signal of a gate-on voltage to the gate of the fifth transistor during the second emission period and to receive a fourth gate signal of a gate-off voltage to the gate of the fifth transistor during a period except for the second emission period, in the second scan period.

The plurality of pixels may include a first pixel emitting light of a first color and a second pixel emitting light of a second color, and a second initialization voltage supplied to the first pixel and a second initialization voltage supplied to the second pixel may be different from each other.

The gate of the fifth transistor may be configured to receive a fourth gate signal of a gate-on voltage during the second scan period.

The plurality of pixels may include a first pixel emitting light of a first color and a second pixel emitting light of a second color, and a second initialization voltage supplied to the first pixel and a second initialization voltage supplied to the second pixel may be different from each other.

The display apparatus may further include a power supply circuit configured to output the first initialization voltage until before the first emission period of the first scan period and to output the second initialization voltage during the first emission period of the first scan period and the second scan period.

According to another aspect of the disclosure, a driving method of a display apparatus including a plurality of pixels, each of the plurality of pixels including a light-emitting diode, a first transistor electrically connected to the light-emitting diode, a second transistor electrically connected to the light-emitting diode, and a third transistor electrically connected to the light-emitting diode and an initialization voltage line. The pixel may be configured to operate, during a frame that may include a first scan period including a writing period for receiving a data signal and a first emission period for emitting light with luminance corresponding to the data signal and a second scan period including a second emission period for maintaining the data signal and emitting light with luminance corresponding to the maintained data signal. In each pixel the driving method comprises receiving a first gate signal of a gate-on voltage to a gate of the second transistor and receiving a second gate signal of a gate-on voltage to a gate of the third transistor in a first period between the writing period and the first emission period of the first scan period. The driving method further comprises each pixel receiving another first gate signal of a gate-on voltage to the gate of the second transistor during the second scan period. The driving method further comprises each pixel receiving another second gate signal of a gate-on voltage to the gate of the third transistor in a second period before the second emission period in the second scan period. The driving method further comprises each pixel receiving a first initialization voltage during the first period of the first scan period, and receiving a second initialization voltage different from the first initialization voltage to the initialization voltage line from a start time point of at least the second period of the second scan period.

The pixel may further include a fifth transistor electrically connected to the driving voltage line and the first transistor, and each pixel may be receiving a third gate signal of a gate-on voltage to a gate of the fifth transistor during the second emission period and receiving a third gate signal of a gate-off voltage to the gate of the fifth transistor during a period except for the second emission period, in the second scan period.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1A:
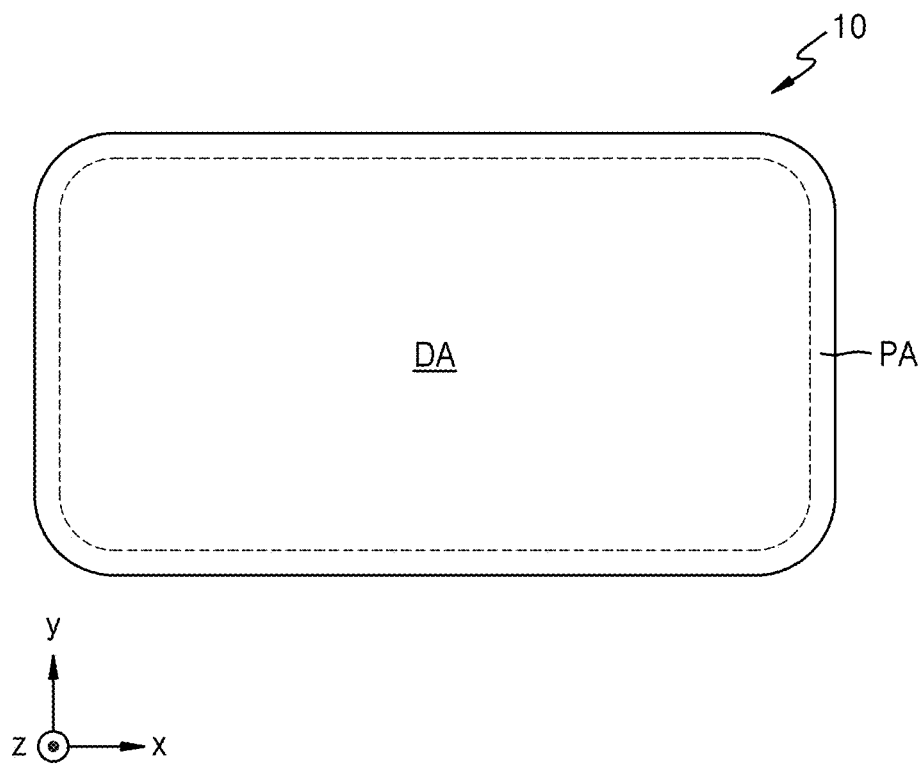
FIGS. 1A and 1B are views schematically illustrating a display apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The phrase "in a plan view" means viewing the object from the top, and the phrase "in a schematic cross-sectional view" means viewing a cross-section of which the object is vertically cut from the side. Hence, the expression "in a plan view" used herein may mean that an object is viewed in a third direction "z" of FIG. 1A or 1B from the top. The phrase "in a schematic cross-sectional view" means viewing a cross-section in a first direction "x" or a second direction "y" of which the object is vertically cut from the side, where the directions "x", "y", and "z" are perpendicular to each other. The direction "z" also can be referred to as a "thickness direction".

Since various modifications and various embodiments of the disclosure are possible, specific embodiments are illustrated in the drawings and described in detail in the detailed description. Effects and features of the disclosure, and a method of achieving them will be apparent with reference to embodiments described below in detail in conjunction with the drawings. However, the disclosure is not limited to the embodiments disclosed herein, but may be implemented in a variety of forms.

In the following embodiments, the terms of the first and second, etc. were used for the purpose of distinguishing one element from other element s, not a limited sense.

The terms "overlap", "overlapping", or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or "to not overlap" another element, this may include that the elements are spaced apart from each other, offset from each other, or set aside from each other or any other suitable term as would be appreciated and understood by those of ordinary skill in the art.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that when an element (or a region, a layer, a portion, or the like) is referred to as "being on", "disposed on", "connected to" or "coupled to" another element in the specification, it can be directly disposed on, connected or coupled to another element mentioned above, or intervening elements may be disposed therebetween. It will be understood that the terms "connected to" or "coupled to" may include a physical or electrical connection or coupling.

In the drawings, sizes, thicknesses, ratios, and dimensions of the elements may be exaggerated for ease of description and for clarity. Like numbers and/or reference characters refer to like elements throughout.

As used herein, the singular forms, "a," "an," and "the" are intended to include the plural forms as well, unless the context clearly indicates otherwise.

The terms "face" and "facing" mean that a first element may directly or indirectly oppose a second element. In a case in which a third element intervenes between the first and second element, the first and second element may be understood as being indirectly opposed to one another, although still facing each other.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In case that an element is referred to as being "in contact" or "contacted" or the like to another element, the element may be in "electrical contact" or in "physical contact" with another element; or in "indirect contact" or in "direct contact" with another element.

A description that a component is "configured to" perform a specified operation may be defined as a case where the component is constructed and arranged with structural features that can cause the component to perform the specified operation.

Embodiments may be described and illustrated in the accompanying drawings in terms of functional blocks, units, and/or modules.

Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies.

In the case of the blocks, units, and/or modules being implemented by microprocessors or other similar hardware, they may be programmed and controlled using software (for example, microcode) to perform various functions discussed herein and may optionally be driven by firmware and/or software.

It is also contemplated that each block, unit, and/or module may be implemented by dedicated hardware, or as a combination of dedicated hardware to perform some functions and a processor (for example, one or more programmed microprocessors and associated circuitry) to perform other functions.

Each block, unit, and/or module of embodiments may be physically separated into two or more interacting and discrete blocks, units, and/or modules without departing from the scope of the disclosure.

Further, the blocks, units, and/or modules of embodiments may be physically combined into more complex blocks, units, and/or modules without departing from the scope of the disclosure.

In the following embodiments, when X and Y are connected, the case where X and Y are electrically connected, the case where X and Y are functionally connected, and the case where X and Y are directly connected may be included. Here, X and Y may be objects (for example, devices, elements, circuits, wires, electrodes, terminals, conductive films, layers, etc.). Thus, the disclosure is not limited to a predetermined connection relationship, for example, the connection relationship indicated in the drawings or the detailed description, and may also include other than the connection relationships indicated in the drawings or the detailed description.

When X and Y are electrically connected, for example, one or more elements (for example, switches, transistors, capacitive elements, inductors, resistance elements, diodes, etc.) enabling electrical connection of X and Y may be connected between X and Y.

In the following embodiment, "ON" used in association with a device state may refer to the activated state of the element, and "OFF" may refer to the deactivated state of the element. "ON" used in connection with a signal received by the element may refer to a signal activating the element, and "OFF" may refer to a signal deactivating the element. The element may be activated by a high level voltage or a low level voltage. For example, a P-channel transistor (P-type transistor) may be activated by a low-level voltage, and an N-channel transistor (N-type transistor) may be activated by a high-level voltage. Thus, it should be understood that the "ON" voltage for the P-type transistor and the N-type transistor is the opposite (low to high) voltage level.

In the following embodiments, the x-direction, the y-direction, and the z-direction are not limited to three axes on a Cartesian coordinate system, and may be interpreted in a broad sense including the same. For example, the x-direction, the y-direction, and the z-direction may be perpendicular to each other, but may refer to different directions that are not orthogonal to each other.

A display apparatus according to embodiments may be an apparatus for displaying a moving image or still image and may be used for a display screen of various products such as portable electronic devices, for example, a mobile phone, a smart phone, a tablet personal computer (PC), a mobile communication terminal, an electronic notebook, an electronic book, a portable multimedia player (PMP), a navigation system, and an ultra mobile PC (PC), televisions, laptop computers, monitors, billboards, Internet of Things (IOT), and the like. A display apparatus 10 according to an embodiment may be used for a wearable device such as a smart watch, a watch phone, a glasses type display, or a head mounted display (HMD). The display apparatus 10 according to an embodiment also may be used as an instrument panel of a vehicle, and a center information display (CID) display disposed on a center fascia or a dashboard of a vehicle, a room mirror display for replacing a side mirror of a vehicle, and a display disposed on the rear surface of the front seat. The display apparatus may be a flexible apparatus.

Figure 1B:
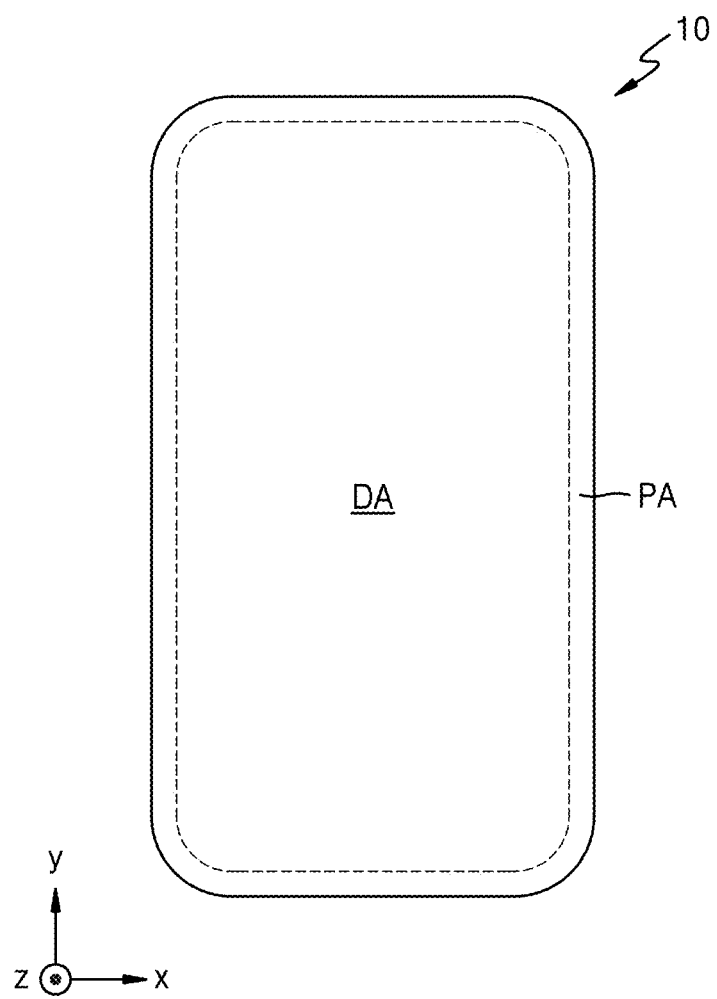
Figure 2:
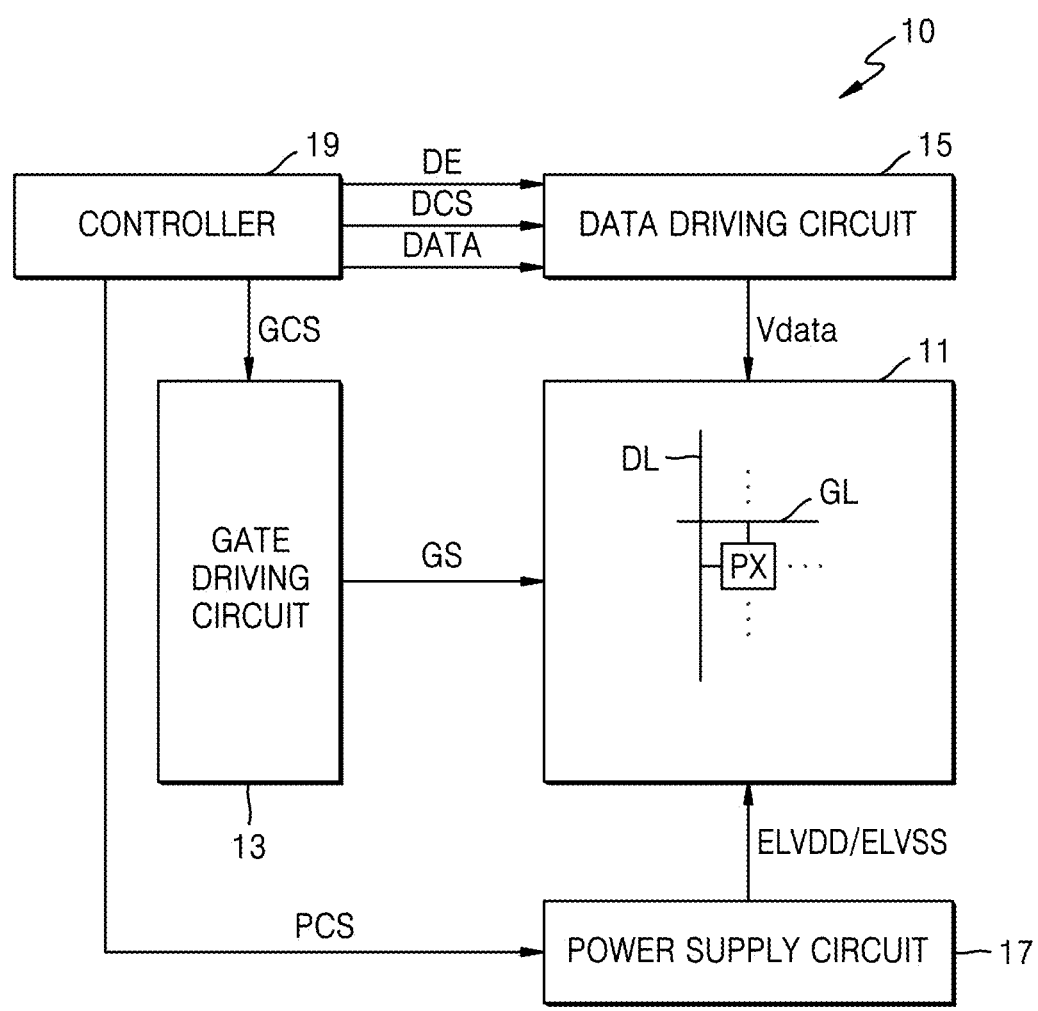
FIG. 2 are views schematically illustrating a display apparatus according to an embodiment.
Figure 3A:
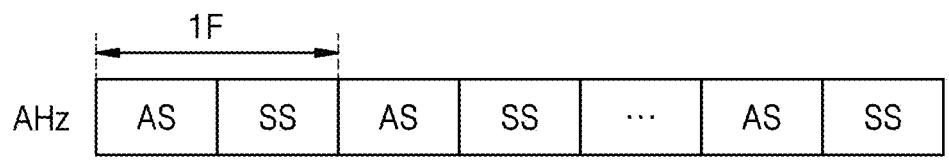
FIGS. 3A and 3B are conceptual views for describing a driving method of a display apparatus according to a driving frequency.
Figure 3B:
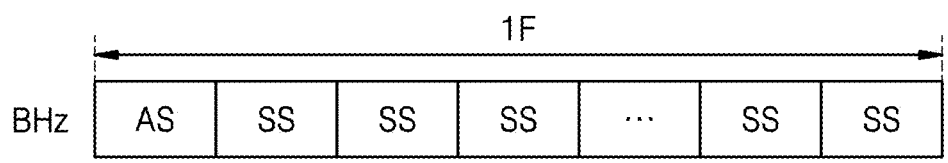

FIGS. 1A and 1B are views schematically illustrating a display apparatus according to an embodiment. FIG. 2 are views schematically illustrating a display apparatus according to an embodiment. FIGS. 3A and 3B are conceptual views for describing a driving method of a display apparatus according to a driving frequency.

Referring to FIGS. 1A and 1B, the display apparatus 10 may include a display area DA in which an image may be displayed, and a peripheral area PA outside the display area DA. The display area DA may be entirely surrounded by the peripheral area PA.

In case that the display area DA is viewed in a plan view in the "z" direction, the display area DA may have a rectangular shape. In an embodiment, the display area DA may be a polygonal shape, such as a triangle, a pentagon, a hexagon, etc., a circular shape, an oval shape, an atypical shape, or the like. The corner of the display area DA may have a round shape. In an embodiment, as shown in FIG. 1A, the display apparatus 10 may have a display area DA having a shape in which the length in the x direction is greater than the length in the y direction. In an embodiment, as shown in FIG. 1B, the display apparatus 10 may have a display area DA having a shape in which the length in the y direction is greater than the length in the x direction.

Referring to FIG. 2, the display apparatus 1 according to an embodiment may include a pixel part 11, a gate driving circuit 13, a data driving circuit 15, a power supply circuit 17, and a controller 19.

The pixel part 11 may be provided in the display area DA. Various conductive lines for transmitting electrical signals to be applied to the display area DA, outer circuits electrically connected to the pixel circuits, and pads to which a printed circuit board or a driver IC chip may be attached, may be located in the peripheral area PA. For example, the gate driving circuit 13, the data driving circuit 15, the power supply circuit 17, and the controller 19 may be provided in the peripheral area PA.

As shown in FIG. 2, gate lines GL, data lines DL, and pixels PX electrically connected thereto may be arranged in the display area DA. The pixels PX may be arranged in various forms such as a stripe arrangement, a PenTile™ arrangement (a diamond arrangement), a mosaic arrangement, and the like. Each of the pixels PX may include an organic light-emitting diode OLED as a display element (a light-emitting device), and the organic light-emitting diode OLED may be electrically connected to a pixel circuit. The pixel circuit may include transistors and at least one capacitor. The pixel PX may emit, for example, red, green, blue, or white light through the organic light-emitting diode OLED. Each pixel PX may be electrically connected to a corresponding one of the gate lines GL and a corresponding one of the data lines DL.

Each of the gate lines GL may extend in the x direction (a row direction) and may be electrically connected to the pixels PX located in the same row. Each of the gate lines GL may transmit a gate signal to the pixels PX in the same row. Each of the gate lines DL may extend in the y direction (a row direction) and may be electrically connected to the pixels PX located in the same column. Each of the data lines DL may transmit data signals to the pixels PX in the same column in synchronization with the gate signals.

In an embodiment, the peripheral area PA may be a kind of non-display area in which the pixels PX are not arranged. In an embodiment, a part of the peripheral area PA may be implemented as the display area DA. For example, the pixels PX may overlap the gate driving circuit 13 at least one corner of the peripheral area PA. Thus, a dead area (understood as an area that has no functional utility) may be reduced and the display area DA may be extended.

The gate driving circuit 13 may be electrically connected to the gate lines GL, may generate gate signals GS in response to a control signal GCS from the controller 19, and may supply the gate signals GS to the gate lines GL sequentially. The gate line GL may be electrically connected to a gate of a transistor included in the pixels PX. The gate signals GS may be gate control signals for controlling turn-on and turn-off of the transistor having a gate electrically connected to the gate lines GL. The gate signals GS may be square wave signals including an on voltage at which the transistor may be turned on (or "activated") and an off voltage in which the transistor may be turned off (or "deactivated").

In FIG. 2, the pixel PX may be electrically connected to one gate line GL. However, this is just an example, and the pixel PX may be electrically connected to two or more gate lines, and the gate driving circuit 13 may supply two or more gate signals GS having different timings at which an on voltage is applied, to corresponding gate lines GL.

The data driving circuit 15 may be electrically connected to data lines DL and may supply data signals to the data lines DL in response to a control signal DCS from the controller 19. Data signal supplied to the data line DL may be supplied to the pixel PX to which the gate signal is supplied. The data driving circuit 15 may convert input image data (DATA of FIG. 2) having a grayscale input from the controller 19 into a data signal in the form of a voltage or current. FIG. 2 illustrates an example in which the data driving circuit 15 outputs a data signal Vdata in the form of a voltage.

The power supply circuit 17 may generate voltages required for driving the pixel PX in response to the control signal PCS from the controller 19. The power supply circuit 17 may generate a first driving voltage ELVDD and a second driving voltage ELVSS to supply the generated first driving voltage ELVDD and second driving voltage ELVSS to the pixels PX. The first driving voltage ELVDD may be a high-level voltage supplied to a first electrode (a pixel electrode or an anode) of the display element included in the pixel PX. The second driving voltage ELVSS may be a low-level voltage supplied to a second electrode (an opposite electrode or a cathode) of the display element included in the pixel PX.

The controller 19 may generate control signals GCS, DCS, and PCS based on signals input from the outside and may supply the control signals GCS, DCS, and PCS to the gate driving circuit 13, the data driving circuit 15, and the power supply circuit 17. The control signal GCS output to the gate driving circuit 13 may include clock signals and a gate start signal. The control signal DCS output to the data driving circuit 15 may include a source start signal and clock signals.

The display apparatus 10 may include a display panel, and the display panel may include a substrate. The pixels PX may be arranged in the display area DA of the substrate. A part or all of the gate driving circuit 13 may be formed (e.g., directly formed) in the peripheral area PA of the substrate during a process of forming a transistor constituting the pixel circuit in the display area DA of the substrate. The data driving circuit 15, the power supply circuit 17, and the controller 19 may be formed in the form of separate integrated circuit (IC) chips or one IC circuit chip and may be disposed on a flexible printed circuit board (FPCB) electrically connected to pads disposed at one side of the substrate. In an embodiment, the data driving circuit 15, the power supply circuit 17, and the controller 19 may be arranged on the substrate in a chip on glass (COG) or chip on plastic (COP) manner.

The display apparatus 10 may support a variable refresh rate (VRR). The refresh rate may be a frequency at which a data signal is substantially written to a driving transistor of a pixel PX, and may represent a screen scanning rate, a screen refresh rate, and the number of image frames (also referred to herein as "frames") played for one second. In an embodiment, the refresh rate may be an output frequency of the gate driving circuit 13 and/or the data driving circuit 15. A frequency corresponding to the refresh rate may be a driving frequency. The display apparatus 10 may adjust an output frequency of the gate driving circuit 13 and an output frequency of the data driving circuit 15 corresponding to the output frequency according to the driving frequency. The display apparatus 10 that supports a VRR may operate while changing the driving frequency in the range of a maximum driving frequency and a minimum driving frequency. For example, in case that the refresh rate is about 60 Hz, a gate signal for writing a data signal at 60 times per second may be supplied to each horizontal line (row). The display apparatus 10 may display an image while changing the driving frequency according to the refresh rate.

One frame 1F (e.g., a single image frame) may include a first scan period AS and one or more second scan periods SS according to the driving frequency. For example, as shown in FIG. 3A, in the display apparatus 10 that operates with the driving frequency of AHz, a frame 1F may include one first scan period AS and one second scan period SS. As shown in FIG. 3B, in the display apparatus 10 that operates with the driving frequency of BHz that is lower than the driving frequency of AHz, a frame 1F may include one first scan period AS and two or more second scan periods SS. As the driving frequency is reduced, the number of the second scan periods SS increases, and the length of the frame 1F may be increased. In an embodiment, a frame 1F may include only one first scan period AS.

The first scan period AS may be defined as an address scan period in which a pixel emits light by writing a data signal to the pixel PX in response to a first gate signal GW. An operation in which the data signal is written from the data line DL to the pixel PX may also be referred to as a data programming operation. In the second scan period SS, the first gate signal GW is not applied to the pixel PX and thus, the second scan period SS may be defined as a self scan period in which no data signal is written. During the second scan period SS, the data signal written during the first scan period AS may be maintained, and a pixel may emit light. The length of the second scan period SS may be the same as the length of the first scan period AS.

Figure 4:
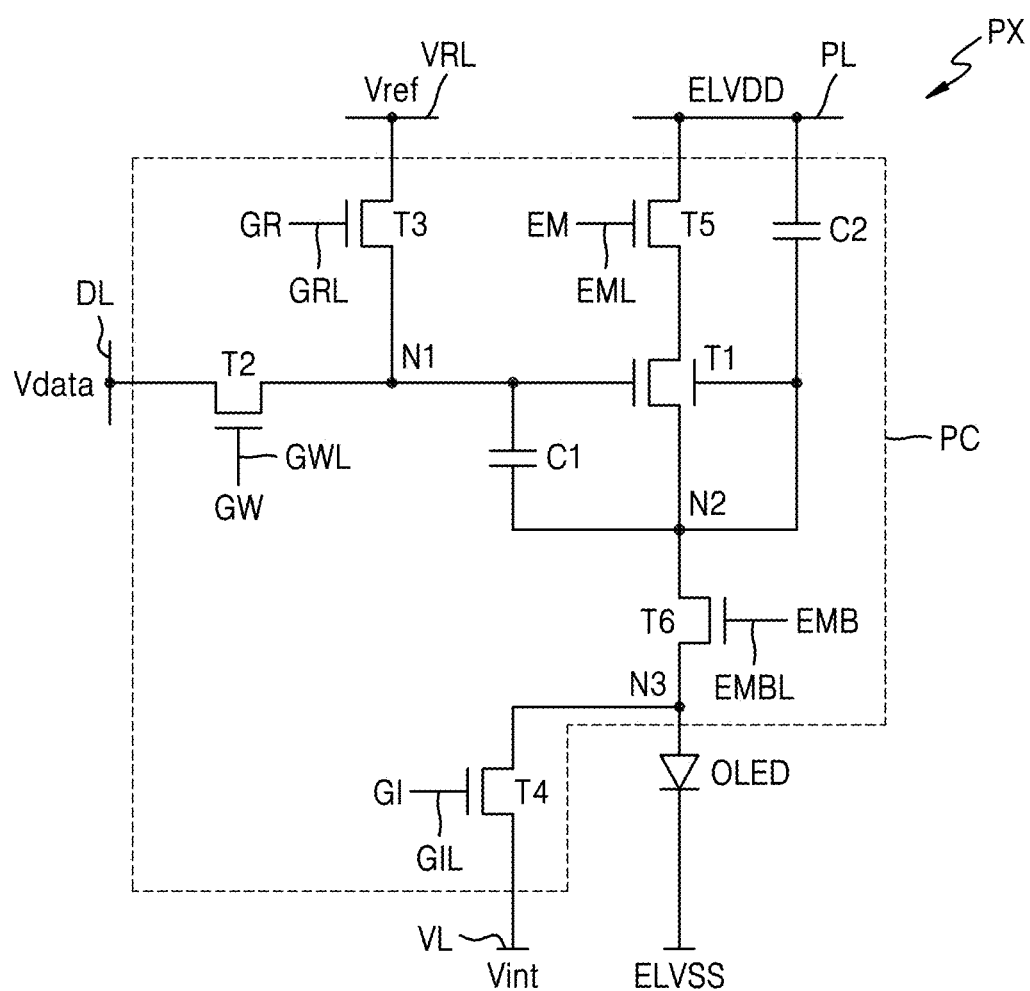
FIG. 4 is a schematic diagram of an equivalent circuit of a pixel according to an embodiment.

FIG. 4 is a schematic diagram of an equivalent circuit of a pixel according to an embodiment.

Referring to FIG. 4, the pixel PX may include a pixel circuit PC electrically connected to a gate line GL and a data line DL, and an organic light-emitting diode OLED as a display element electrically connected to the pixel circuit PC.

A pixel PX may be electrically connected to a first gate line GWL for transmitting a first gate signal GW, a second gate line GIL for transmitting a second gate signal GI, a third gate line GRL for transmitting a third gate signal GR, a fourth gate line EML for transmitting a fourth gate signal EM, a fifth gate line EMBL for transmitting a fifth gate signal EMB, and a data line DL for transmitting a data signal Vdata. Since the emission of the pixel PX may be controlled by the fourth gate signal EM and the fifth gate signal EMB, the fourth gate signal EM and the fifth gate signal EMB may be referred to as an emission control signal, and the fourth gate line EML and the fifth gate line EMBL may be referred to as an emission control line.

Also, the pixel PX may be electrically connected to a driving voltage line PL for transmitting a first driving voltage ELVDD, a reference voltage line VRL for transmitting a reference voltage Vref, and an initialization voltage line VL for transmitting an initialization voltage Vint.

In the pixel part 11 illustrated in FIG. 2, first to fifth gate lines may be disposed, and the gate driving circuit 13 may apply a first gate signal GW, a second gate signal GI, a third gate signal GR, a fourth gate signal EM, and a fifth gate signal EMB to the first gate lines GWL, the second gate lines GIL, the third gate lines GRL, the fourth gate lines EML, and the fifth gate lines EMBL, respectively. The power supply circuit 17 may generate a reference voltage Vref and an initialization voltage Vint to supply the reference voltage Vref and the initialization voltage Vint to the pixels PX.

The voltage level of the first driving voltage ELVDD may be higher than the voltage level of the second driving voltage ELVSS. The voltage level of the reference voltage Vref may be lower than the voltage level of the first driving voltage ELVDD. The voltage level of the initialization voltage Vint may be lower than the voltage level of the second driving voltage ELVSS.

In an embodiment, transistors included in the pixel circuit PC may be N-type oxide thin-film transistors. The oxide thin-film transistor may be a low temperature polycrystalline oxide (LTPO) thin-film transistor in which an active pattern (semiconductor) includes an oxide. However, this is just an example, and N-type transistors are not limited thereto. For example, the active pattern (semiconductor) included in the N-type transistor may include an inorganic semiconductor (e.g., amorphous silicon), polysilicon, an organic semiconductor, or the like, or a combination thereof.

The pixel circuit PC may include first through sixth transistors T1 to T6, and first and second capacitors C1 and C2. The first transistor T1 may be a driving transistor that outputs a driving current corresponding to a data signal, and the second through sixth transistors T2 to T6 may be switching transistors for transmitting signals. A first terminal (first electrode) and a second terminal (second electrode) of each of the first through sixth transistors T1 to T6 may be a source or a drain according to voltages of the first terminal and the second terminal. For example, according to voltages of the first terminal and the second terminal, the first terminal may be a drain, the second terminal may be a source, or the first terminal may be a source and the second terminal may be a drain. A node to which the first gate of the first transistor T1 is electrically connected may be defined as a first node N1, and a node to which the second terminal of the first transistor T1 is electrically connected may be defined as a second node N2.

The first transistor T1 may be electrically connected between the driving voltage line PL and the second node N2. The first transistor T1 may include a gate, a first terminal, and a second terminal electrically connected to the second node N2. The gate of the first transistor T1 may include a first gate electrically connected to the first node N1 and a second gate electrically connected to the second node N2. The first gate and the second gate may be disposed in different layers to face each other. For example, the first gate and the second gate of the first transistor T1 may be disposed to face each other with a semiconductor layer therebetween.

The first gate of the first transistor T1 may be electrically connected to the second terminal of the second transistor T2, the first terminal of the third transistor T3, and the first capacitor C1. The second gate of the first transistor T1 may be electrically connected to the first terminal of the sixth transistor T6, the first capacitor C1, and the second capacitor C2. The first terminal of the first transistor T1 may be electrically connected to a driving voltage line PL via a fifth transistor T5, and the second terminal of the first transistor T1 may be electrically connected to a pixel electrode of the organic light-emitting diode OLED via a sixth transistor T6. The first terminal of the first transistor T1 may be electrically connected to the second terminal of the fifth transistor T5. The second gate of the first transistor T1 may be electrically connected to the first terminal of the sixth transistor T6, the first capacitor C1, and the second capacitor C2. The first transistor T1 may control the amount of a driving current flowing through the organic light-emitting diode OLED by receiving a data signal Vdata according to a switching operation of the second transistor T2.

The second transistor T2 (a write transistor) may be electrically connected between the data line DL and the first gate of the first transistor T1. The second transistor T2 may include a gate electrically connected to the first gate line GWL, a first terminal electrically connected to the data line DL, and a second terminal electrically connected to the first node N1. The second terminal of the second transistor T2 may be electrically connected to the first gate of the first transistor T1, the first terminal of the third transistor T3, and the first capacitor C1. The second transistor T2 may be turned on by the first gate signal GW transmitted to the first gate line GWL, may be configured to electrically connect the data line DL to the first node N1 and may transmit a data signal Vdata transmitted to the data line DL to the first node N1.

The third transistor T3 (a first initialization transistor) may be electrically connected between the first gate of the first transistor T1 and a reference voltage line VRL. The third transistor T3 may include a gate electrically connected to the third gate line GRL, a first terminal electrically connected to the first node N1, and a second terminal electrically connected to the reference voltage line VRL. The first terminal of the third transistor T3 may be electrically connected to the first gate of the first transistor T1, the second terminal of the second transistor T2, and the first capacitor C1. The third transistor T3 may be turned on by a third gate signal GR transmitted to the third gate line GRL and may transmit the reference voltage Vref transmitted to the reference voltage line VRL to the first node N1.

The fourth transistor T4 (a second initialization transistor or a reset transistor) may be electrically connected between the sixth transistor T6 and the initialization voltage line VL. The fourth transistor T4 may be electrically connected between the organic light-emitting diode OLED and the initialization voltage line VL. The fourth transistor T4 may include a gate electrically connected to the second gate line GIL, a first terminal electrically connected to the third node N3, and a second terminal electrically connected to the initialization voltage line VL. The first terminal of the fourth transistor T4 may be electrically connected to a second terminal of the sixth transistor T1 and the organic light-emitting diode OLED. The fourth transistor T4 may be turned on by a second gate signal GI transmitted to the second gate line GIL and may transmit the initialization voltage line Vint transmitted to the initialization voltage line VL to the third node N3.

The fifth transistor T5 (a first emission control transistor) may be electrically connected between the driving voltage line PL and the first transistor T1. The fifth transistor T5 may include a gate electrically connected to the fourth gate line EML, a first terminal electrically connected to the driving voltage line PL, and a second terminal electrically connected to the first terminal of the first transistor T1. The fifth transistor T5 may be turned on or turned off according to a fourth gate signal EM transmitted to the fourth gate line EML.

The sixth transistor T6 (a second emission control transistor) may be electrically connected between the first transistor T1 and the organic light-emitting diode OLED. The sixth transistor T6 may be electrically connected between the second node N2 and the third node N3. The sixth transistor T6 may include a gate electrically connected to the fifth gate line EMBL, a first terminal electrically connected to the second node N2, and a second terminal electrically connected to the third node N3. The first terminal of the sixth transistor T6 may be electrically connected to the second terminal of the first transistor T1, the first capacitor C1, and the second capacitor C2. The second terminal of the sixth transistor T6 may be electrically connected to a first terminal of the fourth transistor T4 and a pixel electrode of the organic light-emitting diode OLED. The sixth transistor T6 may be turned on or turned off according to a fifth gate signal EMB transmitted to the fifth gate line EMBL.

The first capacitor C1 may be electrically connected between the first gate of the first transistor T1 and the second terminal of the first transistor T1. The first electrode of the first capacitor C1 may be electrically connected to the first node N1, and the second electrode of the first capacitor C1 may be electrically connected to the second node N2. The first electrode of the first capacitor C1 may be electrically connected to the first gate of the first transistor T1, the second terminal of the second transistor T2, and the first terminal of the third transistor T3. The second electrode of the first capacitor C1 may be electrically connected to the second terminal and the second gate of the first transistor T1 and the second electrode of the second capacitor C2 and the first terminal of the sixth transistor T6. The first capacitor C1 may be a storage capacitor and may store a threshold voltage of the first transistor T1 and a voltage corresponding to the data signal Vdata.

The second capacitor C2 may be electrically connected between the driving voltage line PL and the second node N2. The first electrode of the second capacitor C2 may be electrically connected to the driving voltage line PL. The second electrode of the second capacitor C2 may be electrically connected to the second terminal and the second gate of the first transistor T1 and the second electrode of the first capacitor C1 and the first terminal of the sixth transistor T6. The capacitance of the first capacitor C1 may be greater than the capacitance of the second capacitor C2.

The organic light-emitting diode OLED may be electrically connected to the first transistor T1 via the sixth transistor T6. The organic light-emitting diode OLED may include a pixel electrode (anode) electrically connected to the third node N3 and an opposite electrode (cathode) facing the pixel electrode, and the opposite electrode may receive a second driving voltage ELVSS. The opposite electrode may be a common electrode that is common to the plurality of pixels PX.

Figure 5:
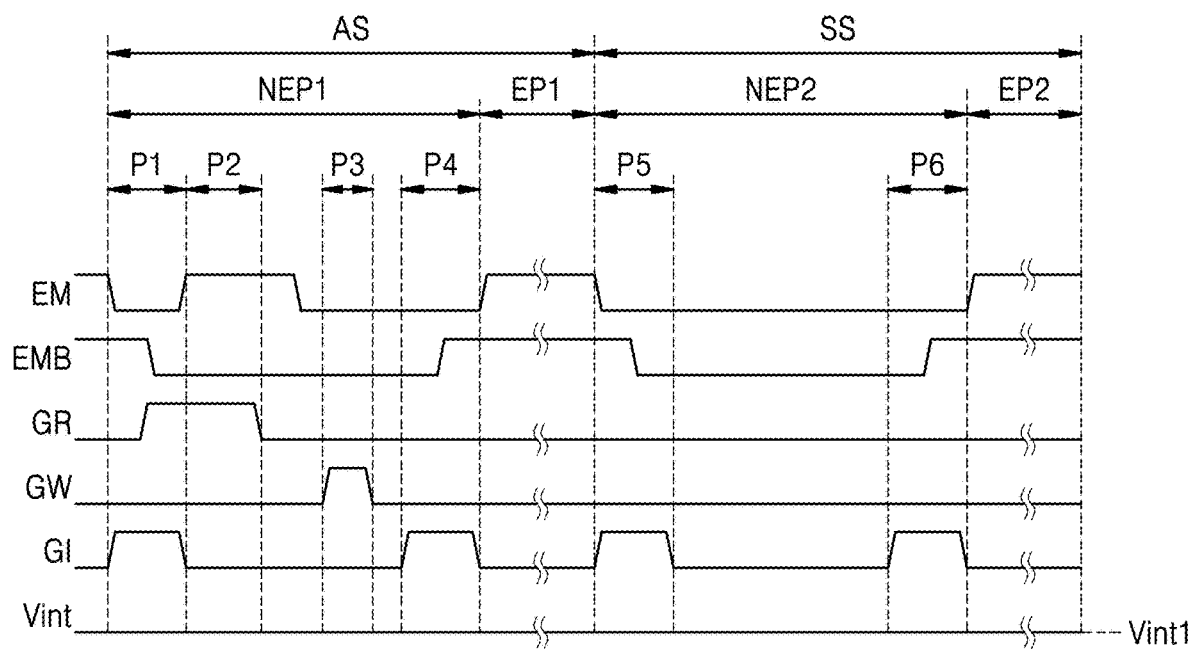
FIGS. 5 and 6 are views schematically illustrating signals for describing an operation of the pixel shown in FIG. 4, according to an embodiment.
Figure 6:
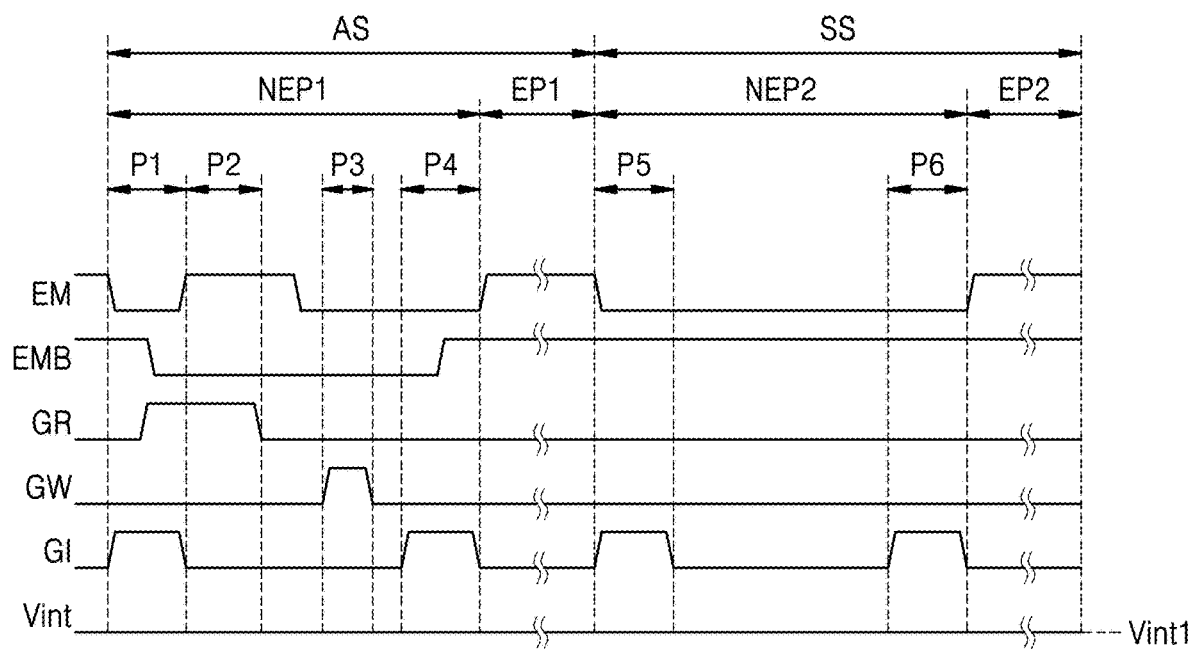
Figure 7:
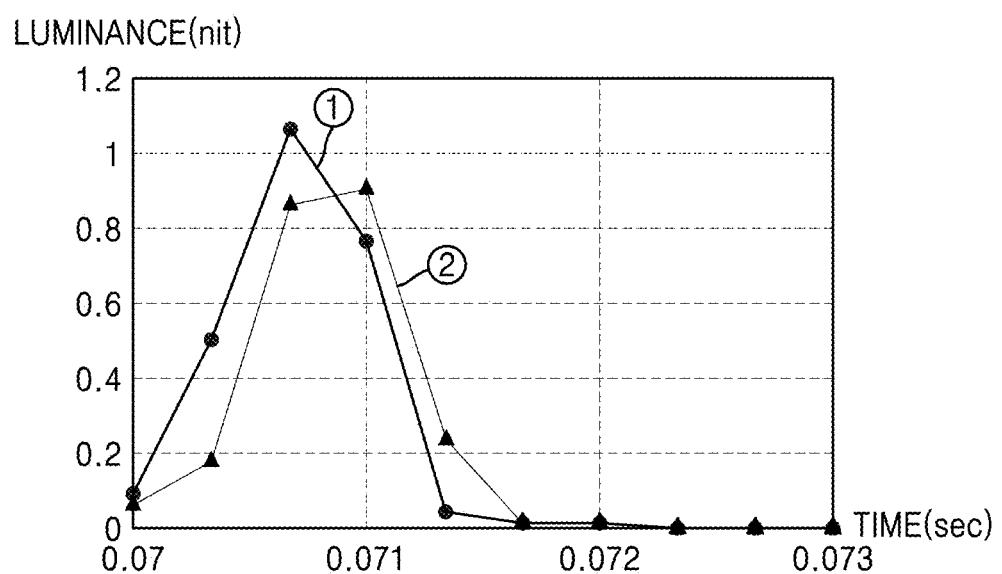
FIG. 7 is a view illustrating luminance of a display apparatus according to embodiments of FIGS. 5 and 6.

FIGS. 5 and 6 are views schematically illustrating signals for describing an operation of the pixel shown in FIG. 4, according to an embodiment. FIG. 7 is a view illustrating luminance of a display apparatus according to embodiments of FIGS. 5 and 6.

In an embodiment, a frame 1F may include one first scan period AS and at least one second scan periods SS. FIGS. 5 and 6 illustrate examples in which a frame 1F includes one first scan period AS and one second scan period SS.

Each of the first gate signal GW, the second gate signal GI, the third gate signal GR, the fourth gate signal EM, and the fifth gate signal EMB may have a high-level voltage (a first level voltage) during some period and may have a low-level voltage (a second level voltage) during some period. Here, the high-level voltage may be a gate on voltage for turning on a transistor, and the low-level voltage may be a gate off voltage for turning off the transistor.

The first scan period AS may include a first non-emission period NEP1 in which the pixel PX does not emit light, and a first emission period EP1 in which the pixel PX emits light. The first non-emission period NEP1 may include a first period P1, a second period P2, a third period P3, and a fourth period P4.

The first period P1 may be a first initialization period (a reset period) in which the first node N1 to which a first gate of the first transistor T1 is electrically connected and the third node N3 to which the pixel electrode of the organic light-emitting diode OLED is connected, are initialized. In the first period P1, a second gate signal GI of a gate-on voltage may be supplied (applied) to the second gate line GIL. A fifth gate signal EMB of a gate-on voltage may be supplied to the fifth gate line EMBL in the first half of the first period P1, and a third gate signal GR of a gate-on voltage may be supplied to the third gate line GRL in the latter half of the first period P1. In the first period P1, the first gate signal GW and the fourth gate signal EM of a gate-off voltage may be supplied to the pixel. The third gate signal GR of a gate-off voltage may be supplied to the pixel in the first half of the first period P1, and the fifth gate signal EMB of a gate-off voltage may be supplied to the pixel in the latter half of the first period P1.

In the first half of the first period P1, the sixth transistor T6 may be turned on by the fifth gate signal EMB, and the fourth transistor T4 may be turned on by the second gate signal GI. The second node N2 and the third node N3 may be changed into a value (approximately, an emission voltage) between an emission voltage and an initialization voltage Vint due to the sixth transistor T6 and the fourth transistor T4. In the latter half of the first period P1, the sixth transistor T6 may be turned off by the fifth gate signal EMB, and the third transistor T3 may be turned on by the third gate signal GR, and the fourth transistor T4 may be turned on by the second gate signal GI. A first node N1, for example, a first gate of the first transistor T1 may be initialized to a reference voltage Vref by the turned-on third transistor T3. The third node N3, for example, the pixel electrode of the organic light emitting diode OLED may be initialized to the initialization voltage Vint by the turned-off sixth transistor T6 and the turned-on fourth transistor T4. Since the pixel electrode of the organic light-emitting diode OLED is reset as the initialization voltage Vint in the first period P1, the first period P1 may also be referred to as a reset period.

The second period P2 may be a compensation period in which a threshold voltage of the first transistor T1 is compensated. In the second period P2, a third gate signal GR of a gate-on voltage may be supplied to the third gate line GRL, and a fourth gate signal EM of a gate-on voltage may be supplied to the fourth gate line EML. The first gate signal GW, the second gate signal GI, and the fifth gate signal EMB of a gate-off voltage may be supplied to the pixel.

The third transistor T3 may be turned on by the third gate signal GR, and the fifth transistor T5 may be turned on by the fourth gate signal EM. Thus, the reference voltage Vref may be supplied to the first node N1, and the first driving voltage ELVDD may be supplied to a first terminal of the first transistor T1 so that the first transistor T1 may be turned on. In case that the voltage of the second terminal of the first transistor T1 falls to a difference (Vref−Vth) between the reference voltage Vref and the threshold voltage Vth of the first transistor T1, the first transistor T1 may be turned off. A voltage corresponding to the threshold voltage Vth of the first transistor T1 may be stored in the first capacitor C1 to compensate for the threshold voltage Vth of the first transistor T1.

The third period P3 may be a writing period in which the data signal Vdata is supplied to the pixel. In the third period P3, a first gate signal GW of a gate-on voltage may be supplied to the first gate line GWL. The second gate signal GI, the third gate signal GR, the fourth gate signal EM, and the fifth gate signal EMB of a gate-off voltage may be supplied to the pixel.

The second transistor T2 may be turned on by the first gate signal GW. The turned-on second transistor T2 may be configured to transmit a data signal Vdata from the data line DL to the first node, i.e., the first gate of the first transistor T1. Thus, the voltage of the first node N1 may be changed from the reference voltage Vref to a voltage corresponding to the data signal Vdata. The voltage of the second node N2 may be changed in response to a voltage variation of the first node N1. The voltage of the second node N2 may be a voltage (Vref−Vth+α×(Vdata−Vref)) changed according to a capacity ratio (α=C1/(C1+C2)) of the first capacitor C1 and the second capacitor C2. Thus, the threshold voltage Vth of the first transistor T1 and a voltage corresponding to the data signal Vdata may be charged in the first capacitor C1.

The fourth period P4 may be a second initialization period for initializing a second node N2 to which a second terminal of the first transistor T1 is electrically connected and a third node N3 to which a pixel electrode of the organic light emitting diode OLED is connected, prior to the first light-emitting period EP1 after data writing. In the fourth period P4, a second gate signal GI of a gate-on voltage may be supplied to the second gate line GIL, and subsequently, a fifth gate signal EMB of a gate-on voltage may be supplied as the fifth gate line EMBL. The first gate signal GW, the third gate signal GR, and the fourth gate signal EM of a gate-off voltage may be supplied to the pixel.

The fourth transistor T4 may be turned on by the second gate signal GI, and the initialization voltage Vint may be transmitted to the pixel electrode of the organic light-emitting diode OLED by the turned-on fourth transistor T4. Subsequently, a sixth transistor T6 may be turned on by the fifth gate signal EMB, and the second node N2 and the third node N3 may share charges by the sixth transistor T6 and the fourth transistor T4 that are turned on.

The first emission period EP1 may be a period in which the organic light-emitting diode OLED emits light. In the first emission period EP1, a fourth gate signal EM of a gate-on voltage may be supplied to the fourth gate line EML, and a fifth gate signal EMB of the gate-on voltage may be supplied to the fifth gate line EMBL. The first gate signal GW, the second gate signal GI, and the third gate signal GR may be gate-off voltages.

In the first emission period EP1, the fifth transistor T5 may be turned on by the fourth gate signal EM, and the first driving voltage ELVDD may be supplied to the first terminal of the first transistor T1 by the fifth transistor T5 that is turned on. The first transistor T1 may output a driving current (Id∝(Vgs−Vth)$^2$ having a magnitude corresponding to a voltage corresponding to the data signal Vdata stored in the first capacitor C1, for example, a voltage (Vgs−Vth) obtained by subtracting a threshold voltage Vth of the first transistor T1 from a gate-source voltage Vgs of the first transistor T1, and the driving current may flow through the sixth transistor T6 turned on by the fifth gate signal EMB, and the organic light-emitting diode OLED may emit light with luminance corresponding to the magnitude of the driving current.

The second scan period SS may include a second non-emission period NEP2 in which the pixel PX does not emit light, and a second emission period EP2 in which the pixel PX emits light. The second non-emission period NEP2 may include a fifth period P5 and a sixth period P6. Each of the fifth period P5 and the sixth period P6 may correspond to the first period P1 and the fourth period P4 of the first scan period AS. A distance between the first period P1 and the fourth period P4 may be the same as a distance between the fifth period P5 and the sixth period P6. The second scan period SS may not include a compensation period corresponding to the second period P2 and a writing period corresponding to the third period P3 of the first scan period AS.

The fifth period P5 may be a third initialization period (a reset period) for initializing the third node N3 to which the pixel electrode of the organic light-emitting diode OLED is connected. The fifth period P5 may correspond to the first period P1 of the first scan period AS. In the fifth period P5, a second gate signal GI of a gate-on voltage may be supplied to the second gate line GIL. In the fifth period P5, the first gate signal GW, the third gate signal GR, and the fourth gate signal EM of a gate-off voltage may be supplied to the pixel.

In the first half of the fifth period P5, a fifth gate signal EMB of a gate-on voltage may be supplied to the fifth gate line EMBL. The sixth transistor T6 may be turned on by the fifth gate signal EMB, and the fourth transistor T4 may be turned on by the second gate signal GI. The second node N2 and the third node N3 may be electrically connected to each other by the sixth transistor T6 and the fourth transistor T4 that are turned on to share charges so that the second node N2 and the third node N3 may be changed into a value (approximately, an emission voltage) between the emission voltage and the initialization voltage Vint.

In the latter half of the fifth period P5, a fifth gate signal EMB of a gate-off voltage may be supplied to the fifth gate line EMBL. The sixth transistor T6 may be turned off by the fifth gate signal EMB so that the second node N2 and the third node N3 may be electrically insulated from each other. The third node N3, for example, the pixel electrode of the organic light-emitting diode OLED may be initialized to the initialization voltage Vint by the turned-on fourth transistor T4.

The sixth period P6 may be a fourth initialization period in which the third node N3, electrically connected to the pixel electrode of the organic light-emitting diode OLED, is initialized prior to the second emission period EP2. The sixth period P6 may correspond to the fourth period P4 of the first scan period AS. In the sixth period P6, a second gate signal GI of a gate-on voltage may be supplied to the second gate line GIL, and subsequently, a fifth gate signal EMB of the gate-on voltage may be supplied to the fifth gate line EMBL. The first gate signal GW, the third gate signal GR, and the fourth gate signal EM of a gate-off voltage may be supplied to the pixel.

The fourth transistor T4 may be turned on by the second gate signal GI, and the initialization voltage Vint may be transmitted to the pixel electrode of the organic light-emitting diode OLED by the turned-on fourth transistor T4. Subsequently, the sixth transistor T6 may be turned on by the fifth gate signal EMB, and the second node N2 and the third node N3 may be electrically connected to each other by the sixth transistor T6 and the fourth transistor T4 that are turned on to share charges so that the second node N2 and the third node N3 may be changed into a value (approximately an emission voltage) between the emission voltage and the initialization voltage Vint.

The second emission period EP2 may be a period in which the organic light-emitting diode OLED emits light. The second emission period EP2 may correspond to the first emission period EP1 of the first scan period AS. In the second emission period EP2, a fourth gate signal EM of a gate-on voltage may be supplied to the fourth gate line EML, and a fifth gate signal EMB of a gate-on voltage may be supplied to the fifth gate line EMBL. The first gate signal GW, the second gate signal GI, and the third gate signal GR may be gate-off voltages.

In the second emission period EP2, the fifth transistor T5 may be turned on by the fourth gate signal EM, and the first driving voltage ELVDD may be supplied to the first terminal of the first transistor T1 by the turned-on fifth transistor T5. The first transistor T1 may output a driving current having a magnitude corresponding to a voltage stored in the first capacitor C1, i.e., the data signal Vdata, and the driving current may flow through the organic light-emitting diode OLED through the sixth transistor T6 turned on by the fifth gate signal EMB, and the organic light-emitting diode OLED may emit light with luminance corresponding to the magnitude of the driving current. In the second emission period EP2, the data signal Vdata stored in the first capacitor C1 may be a signal in which the data signal supplied to the pixel in the third period P3 of the first scan period AS.

In an embodiment, as shown in FIG. 6, the fifth gate signal EMB may be supplied to the gate-on voltage during the second scan period SS. For example, in the sixth period P6, a second gate signal GI of a gate-on voltage may be supplied to the second gate line GIL, and a fifth gate signal EMB of the gate-on voltage may be supplied to the fifth gate line EMBL. Thus, the second node N2 and the third node N3 may be set as the initialization voltage Vint by the fourth transistor T4 and the sixth transistor T6 that are turned on.

The gate driving circuit 13 according to the embodiment shown in FIG. 6 may supply the fifth gate signal EMB as a constant gate-on voltage without a voltage level variation during the second scan period SS so that power consumption compared to the gate driving circuit 13 according to the embodiment shown in FIG. 5 may be reduced.

In the embodiments shown in FIGS. 5 and 6, the initialization voltage Vint supplied to the pixel electrode of the organic light-emitting diode OLED by the fourth transistor T4 may be a constant value of the first initialization voltage Vint1 during a frame.

In the embodiment shown in FIG. 5, in case that the first emission period EP1 starts, a voltage of the second terminal (the second node N2) of the first transistor T1 may have a value between a voltage of the second node N2 set according to the data signal Vdata in the third period P3 and the first initialization voltage Vint1 of the third node N3 set in the fourth period P4. In case that the second emission period EP2 starts, the voltage of the second terminal of the first transistor T1 may have a value (approximately emission voltage) between the emission voltage and the first initialization voltage Vint1 of the third node N3 set in the sixth period P6.

In the embodiment shown in FIG. 6, in case that the first emission period EP1 starts, a voltage of the second terminal of the first transistor T1 may have a value between a voltage of the second node N2 set according to the data signal Vdata in the third period P3 and the first initialization voltage Vint1 of the third node N3 set in the fourth period P4. In case that the second emission period EP2 starts, the voltage of the second terminal of the first transistor T1 may be the first initialization voltage Vint1 of the third node N3 set in the sixth period P6.

In the embodiment shown in FIG. 6, in case that the second emission period EP2 starts, the voltage of the second terminal of the first transistor T1 may be less than the voltage of the second terminal of the first transistor T1 in case that the second light emitting period EP2 starts in the embodiment shown in FIG. 5. In the embodiment shown in FIG. 6, the voltage difference between the voltage of the second terminal of the first transistor T1 in case that the first emission period EP1 starts and the voltage of the second terminal of the first transistor T1 in case that the second emission period EP2 starts may be greater than the voltage difference of the voltage of the second terminal of the first transistor T1 in case that the first emission period EP1 starts and the voltage of the second terminal of the first transistor T1 in case that the second emission period EP2 starts in the embodiment shown in FIG. 5.

Thus, as shown in FIG. 7, emission delay occurs in the embodiment illustrated in FIG. 6 compared to the embodiment shown in FIG. 5, and the luminance (graph ①) of the display apparatus in the second light emitting period EP2 according to the embodiment shown in FIG. 6 may be lower than the luminance (graph ②) of the display apparatus in the second emission period EP2 according to the embodiment illustrated in FIG. 5.

According to an embodiment, the display apparatus 1 may supply a fifth gate signal EMB of a gate-on voltage to the fifth gate line EMBL in the second scan period SS to reduce power consumption, and may supply a second initialization voltage Vint2 having a value higher than the first initialization voltage Vint1 at least before a starting time point of the fifth period P5 of the second scan period SS, i.e., before an initialization voltage is supplied to the pixel electrode of the organic light-emitting diode OLED, thereby minimizing a luminance difference between the first scan period AS and the second scan period SS.

The second initialization voltage Vint2 may be a value set based on an emission voltage for each grayscale. For example, the second initialization voltage Vint2 may be an average of emission voltages for each grayscale. The emission voltage may be a voltage required for emission of the organic light-emitting diode OLED according to grayscale of the data signal. The second initialization voltage Vint2 may have a higher voltage level than the first initialization voltage Vint1 and may have a voltage level lower than that of the emission voltage.

Figure 8:
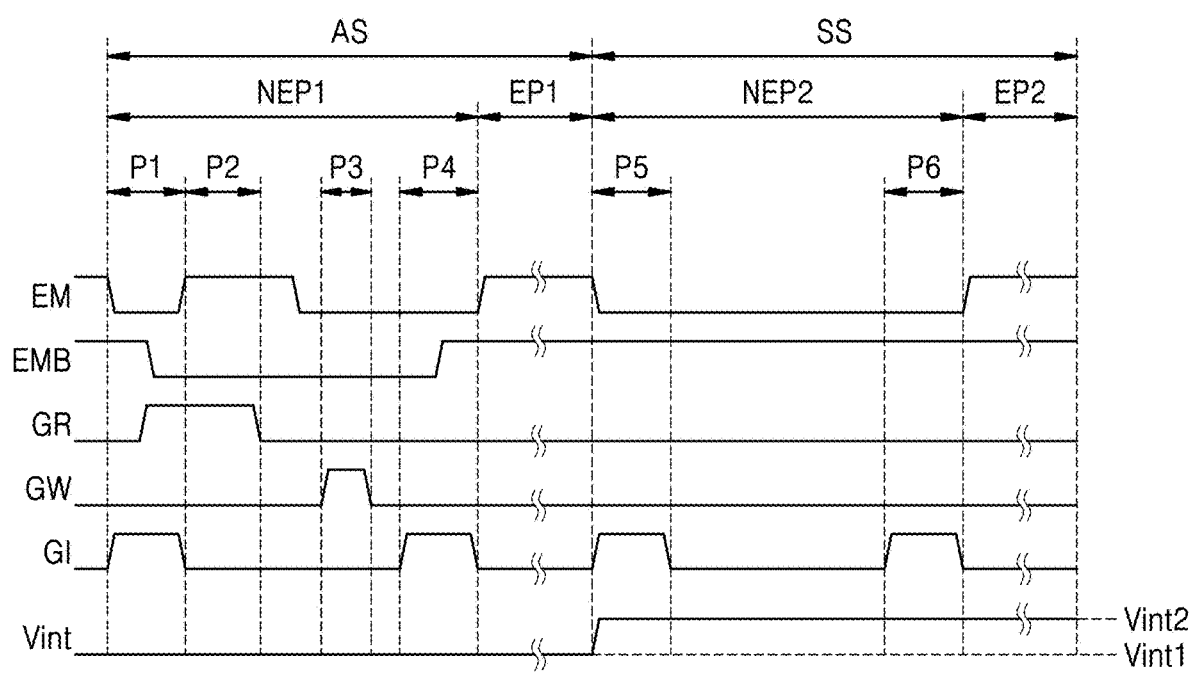
FIG. 8 is a view schematically illustrating signals for describing an operation of the pixel shown in FIG. 4, according to an embodiment.

FIG. 8 is a view schematically illustrating signals for describing an operation of the pixel shown in FIG. 4, according to an embodiment.

The same reference numerals are used for the periods and signals described with reference to FIG. 6 in FIG. 8, and a redundant description thereof will be omitted. The signals shown in FIG. 8 may be substantially the same as or similar to the signals shown in FIG. 6, except for the voltage level of the initialization voltage Vint.

Referring to FIG. 8, the power supply circuit 17 may supply the initialization voltage Vint as the first initialization voltage Vint1 during the first scan period AS, and may supply the initialization voltage Vint as the second initialization voltage Vint2 during the second scan period SS. The voltage level of the second initialization voltage Vint2 may be higher than the voltage level of the first initialization voltage Vint1.

In the first half of the first period P1, a second gate signal GI of a gate-on voltage may be supplied to the second gate line GIL, and a fifth gate signal EMB of a gate-on voltage may be supplied to the fifth gate line EMBL. The first gate signal GW, the third gate signal GR, and the fourth gate signal EM of a gate-off voltage may be supplied to the pixel. The sixth transistor T6 may be turned on by the fifth gate signal EMB, and the fourth transistor T4 may be turned on by the second gate signal GI. The second node N2 and the third node N3 may be changed into a value (approximately, an emission voltage) between an emission voltage and the first initialization voltage Vint1 due to the sixth transistor T6 and the fourth transistor T4 that are turned on.

In the latter half of the first period P1, a second gate signal GI of a gate-on voltage may be supplied to the second gate line GIL, and a third gate signal GR of the gate-on voltage may be supplied to the third gate line GRL. The first gate signal GW, the fourth gate signal EM, and the fifth gate signal EMB of a gate-off voltage may be supplied to the pixel. The sixth transistor T6 may be turned off by the fifth gate signal EMB, and the third transistor T3 may be turned on by the third gate signal GR, and the fourth transistor T4 may be turned on by the second gate signal GI. A first gate of the first transistor T1 may be initialized to a reference voltage Vref by the turned-on third transistor T3. The pixel electrode of the organic light emitting diode OLED may be initialized to the first initialization voltage Vint1 by the turned-off sixth transistor T6 and the turned-on fourth transistor T4.

In the second period P2, a third gate signal GR of a gate-on voltage may be supplied to the third gate line GRL, and a fourth gate signal EM of a gate-on voltage may be supplied as the fourth gate line EML. The first gate signal GW, the second gate signal GI, and the fifth gate signal EMB of a gate-off voltage may be supplied to the pixel. The third transistor T3 may be turned on by the third gate signal GR, and the fifth transistor T5 may be turned on by the fourth gate signal EM so that the first transistor T1 may be turned on. In case that the voltage of the second terminal of the first transistor T1 drops to the difference (Vref-Vth) of the reference voltage Vref and the threshold voltage Vth of the first transistor T1, the first transistor T1 may be turned off, and the voltage corresponding to the threshold voltage Vth of the first transistor T1 may be stored in the first capacitor C1 to compensate for the threshold voltage Vth of the first transistor T1. Since the fourth transistor T4 and the sixth transistor T6 are turned off, the pixel electrode of the organic light-emitting diode OLED may maintain the first initialization voltage Vint1.

In the third period P3, a first gate signal GW of a gate-on voltage may be supplied to the first gate line GWL. The second gate signal GI, the third gate signal GR, the fourth gate signal EM, and the fifth gate signal EMB of a gate-off voltage may be supplied to the pixel. The second transistor T2 may be turned on by the first gate signal GW. The turned-on second transistor T2 may be configured to transmit a data signal Vdata from the data line DL to the first gate of the first transistor T1. Thus, the threshold voltage Vth of the first transistor T1 and a voltage corresponding to the data signal Vdata may be charged in the first capacitor C1.

In the fourth period P4, a second gate signal GI of a gate-on voltage may be supplied to the second gate line GIL, and subsequently, a fifth gate signal EMB of a gate-on voltage may be supplied as the fifth gate line EMBL. The first gate signal GW, the third gate signal GR, and the fourth gate signal EM of a gate-off voltage may be supplied to the pixel. The fourth transistor T4 may be turned on by the second gate signal GI, and the first initialization voltage Vint1 may be transmitted to the pixel electrode of the organic light-emitting diode OLED by the turned-on fourth transistor T4. Subsequently, a sixth transistor T6 may be turned on by the fifth gate signal EMB, and the second node N2 and the third node N3 may share charges by the sixth transistor T6 and the fourth transistor T4 that are turned on.

In the first emission period EP1, a fourth gate signal EM of a gate-on voltage may be supplied to the fourth gate line EML, and a fifth gate signal EMB of a gate-on voltage may be supplied to the fifth gate line EMBL. The first gate signal GW, the second gate signal GI, and the third gate signal GR may be gate-off voltages. The fifth transistor T5 may be turned on by the fourth gate signal EM, the first transistor T1 may output a driving current corresponding to the data signal Vdata stored in the first capacitor C1, and the driving current may flow through the organic light-emitting diode OLED through the sixth transistor T6 turned on by the fifth gate signal EMB, and the organic light-emitting diode OLED may emit light with luminance corresponding to a magnitude of the driving current.

In the fifth period P5, a second gate signal GI of a gate-on voltage may be supplied to the second gate line GIL, and a fifth gate signal EMB of the gate-on voltage may be supplied to the fifth gate line EMBL. The first gate signal GW, the third gate signal GR, and the fourth gate signal EM of a gate-off voltage may be supplied to the pixel. The sixth transistor T6 may be turned on by the fifth gate signal EMB, and the fourth transistor T4 may be turned on by the second gate signal GI. The second node N2 and the third node N3 may be set as the second initialization voltage Vint2 by the sixth transistor T6 and the fourth transistor T4 that are turned on.

In the sixth period P6, a second gate signal GI of a gate-on voltage may be supplied to the second gate line GIL, and a fifth gate signal EMB of the gate-on voltage may be supplied to the fifth gate line EMBL. The first gate signal GW, the third gate signal GR, and the fourth gate signal EM of a gate-off voltage may be supplied to the pixel. The sixth transistor T6 may be turned on by the fifth gate signal EMB, and the fourth transistor T4 may be turned on by the second gate signal GI. The second node N2 and the third node N3 may be set as the second initialization voltage Vint2 by the sixth transistor T6 and the fourth transistor T4 that are turned on.

In the pixel PX according to the embodiment shown in FIG. 8, in case that the second emission period EP2 starts, the voltage of the second terminal of the first transistor T1 may be the second initialization voltage Vint2 of the third node N3 set in the sixth period P6. Since the voltage level of the second initialization voltage Vint2 may be higher than the voltage level of the first initialization voltage Vint1, the voltage difference between the voltage of the second terminal of the first transistor T1 and the voltage of the second terminal of the first transistor T1 may be reduced in case that the second emission period EP2 starts so that a luminance difference between a luminance of the display apparatus in the first emission period EP1 and a luminance of the display apparatus in the second emission period EP2 may be reduced. Also, during the second scan period SS, power consumption may be reduced without a voltage variation of the fifth gate signal EMB.

The embodiment shown in FIG. 8 is an example in which the second initialization voltage Vint2 may be supplied to the pixel PX at a start time point of the second scan period SS, i.e., at the start time point of the fifth period P5.

Figure 9:
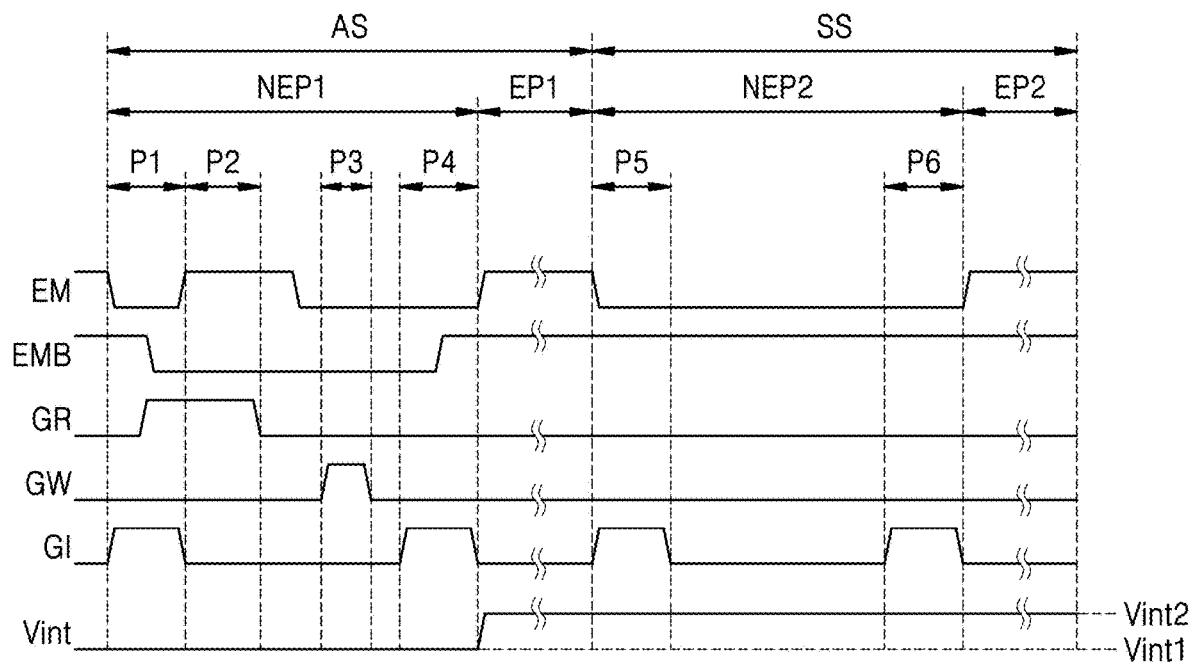
FIGS. 9 through 11 are views schematically illustrating signals for describing an operation of the pixel shown in FIG. 4, according to an embodiment.
Figure 10:
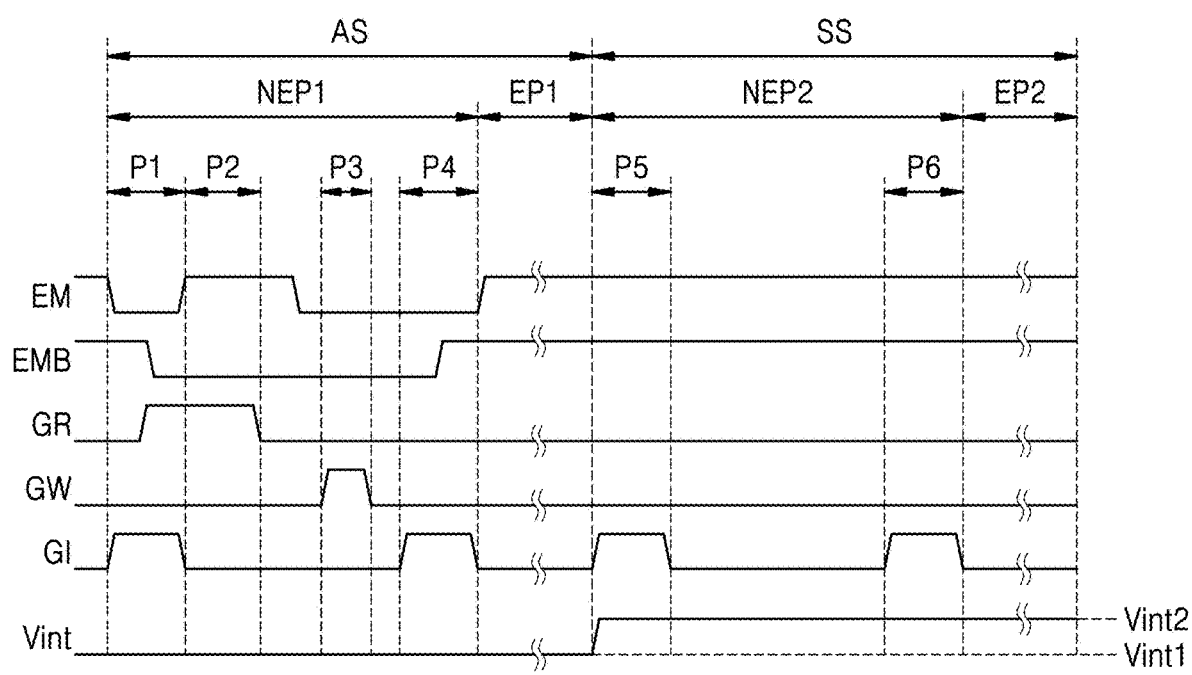
Figure 11:
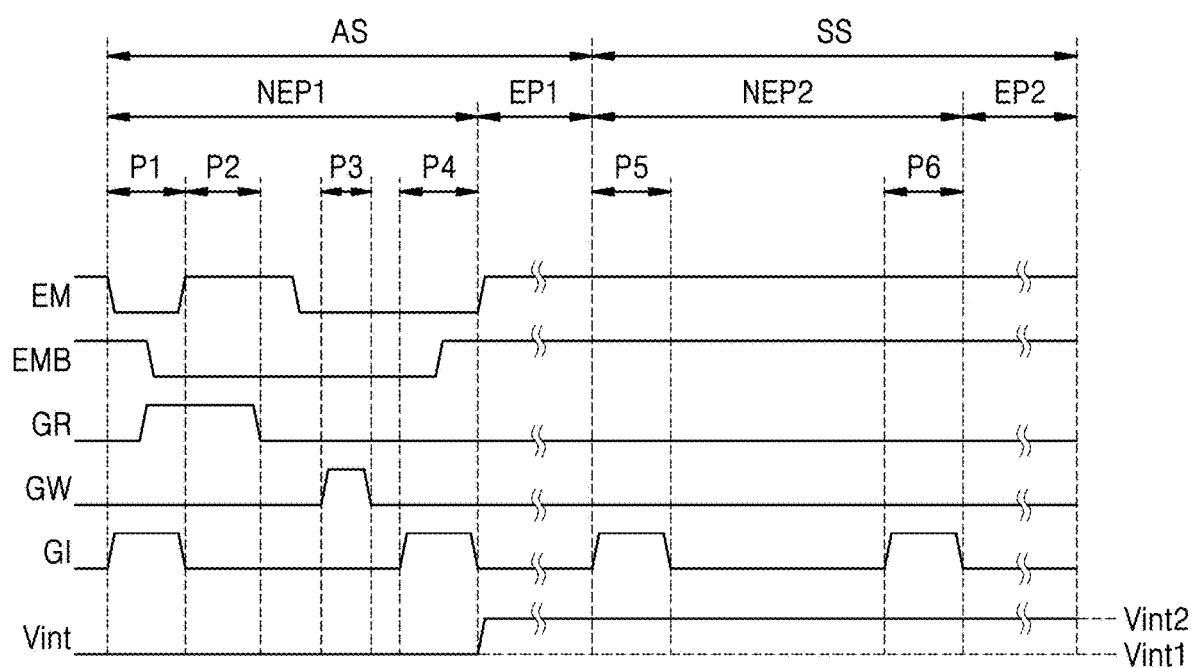

FIGS. 9 through 11 are views schematically illustrating signals for describing an operation of the pixel shown in FIG. 4, according to an embodiment; In FIGS. 9 through 11, the same reference numerals are used for the periods and signals described with reference to FIG. 8, and a redundant description thereof will be omitted.

The signals shown in FIG. 9 may be substantially the same as or similar to the signals shown in FIG. 8, except for supply time point of a second initialization voltage Vint2.

Referring to FIG. 9, a power supply circuit 17 may supply the initialization voltage Vint of a first initialization voltage Vint1 for the first non-emission period NEP1 of the first scan period AS, and may supply the initialization voltage Vint of the second initialization voltage Vint2 during the first emission period EP1 of the first scan period AS and the second scan period SS.

The embodiment shown in FIG. 9 is an example in which the second initialization voltage Vint2 may be supplied to the pixel PX prior to the start of the second scan period SS, i.e., prior to the start of the fifth period P5, and the second initialization voltage Vint2 may be supplied to the pixel PX from an arbitrary time point of the first emission period EP1. In FIG. 9, the second initialization voltage Vint2 may be supplied to the pixel PX from the start time point of the first emission period EP1.

The signals shown in FIG. 10 may be substantially the same as or similar to the signals shown in FIG. 8, except for a voltage level of the fourth gate voltage EM.

Referring to FIG. 10, the gate driving circuit 13 may output a fourth gate voltage EM of a gate-off voltage during a first period P1, a third period P3, and a fourth period P4 of a first scan period AS, and may output a fourth gate voltage EM of a gate-on voltage during remaining periods of the first scan period AS and a second scan period SS. The gate driving circuit 13 may output a fifth gate voltage EMB of a gate-on voltage in the first emission period EP1 of the first scan period AS and the second scan period SS. In the second scan period SS, a fourth gate signal EM of a gate-on voltage may be supplied to the fourth gate line EML, and a fifth gate signal EMB of a gate-on voltage may be supplied to the fifth gate line EMBL.

The power supply circuit 17 may output the first initialization voltage Vint1 during the first scan period AS, and may output the second initialization voltage Vint2 during the second scan period SS.

In the fifth period P5 and the sixth period P6, the second gate signal GI of the gate-on voltage may be supplied to the second gate line GL, the fourth gate signal EM of a gate-on voltage may be supplied to the fourth gate line EML, and the fifth gate signal EMB of a gate-on voltage may be supplied to the fifth gate line EMBL. The first gate signal GW and the third gate signal GR of a gate-off voltage may be supplied to the pixel. The fifth transistor T5 may be turned on by the fourth gate signal EM, and the sixth transistor T6 may be turned on by the fifth gate signal EMB, and the fourth transistor T4 may be turned on by the second gate signal GI. The second node N2 and the third node N3 may be set as the second initialization voltage Vint2 by the sixth transistor T6 and the fourth transistor T4 that are turned on.

In the display apparatus according to the embodiment shown in FIG. 10, the gate driving circuit 13 may supply the fourth gate signal EM and the fifth gate signal EMB of a constant gate-on voltage without a voltage level variation for the second scan period SS so that power consumption may be reduced.

The signals shown in FIG. 11 may be substantially the same as or similar to the signals shown in FIG. 9, except for a voltage level of the fourth gate voltage EM.

Referring to FIG. 11, the gate driving circuit 13 may output a fourth gate voltage EM of a gate-off voltage during a first period P1, a third period P3, and a fourth period P4 of a first scan period AS, and may output a fourth gate voltage EM of a gate-on voltage during remaining periods of the first scan period AS and a second scan period SS. The gate driving circuit 13 may output a fifth gate voltage EMB of a gate-on voltage in the first emission period EP1 of the first scan period AS and the second scan period SS.

The power supply circuit 17 may supply the initialization voltage Vint of a first initialization voltage Vint1 for the first non-emission period NEP1 of the first scan period AS, and may supply the initialization voltage Vint of the second initialization voltage Vint2 during the first emission period EP1 of the first scan period AS and the second scan period SS.

FIGS. 12 through 15 are views schematically illustrating signals for describing an operation of the pixel shown in FIG. 4, according to an embodiment.

In FIGS. 12 through 15, the same reference numerals are used for the periods and signals described with reference to FIGS. 8 through 12, and a redundant description thereof will be omitted.

Figure 12:
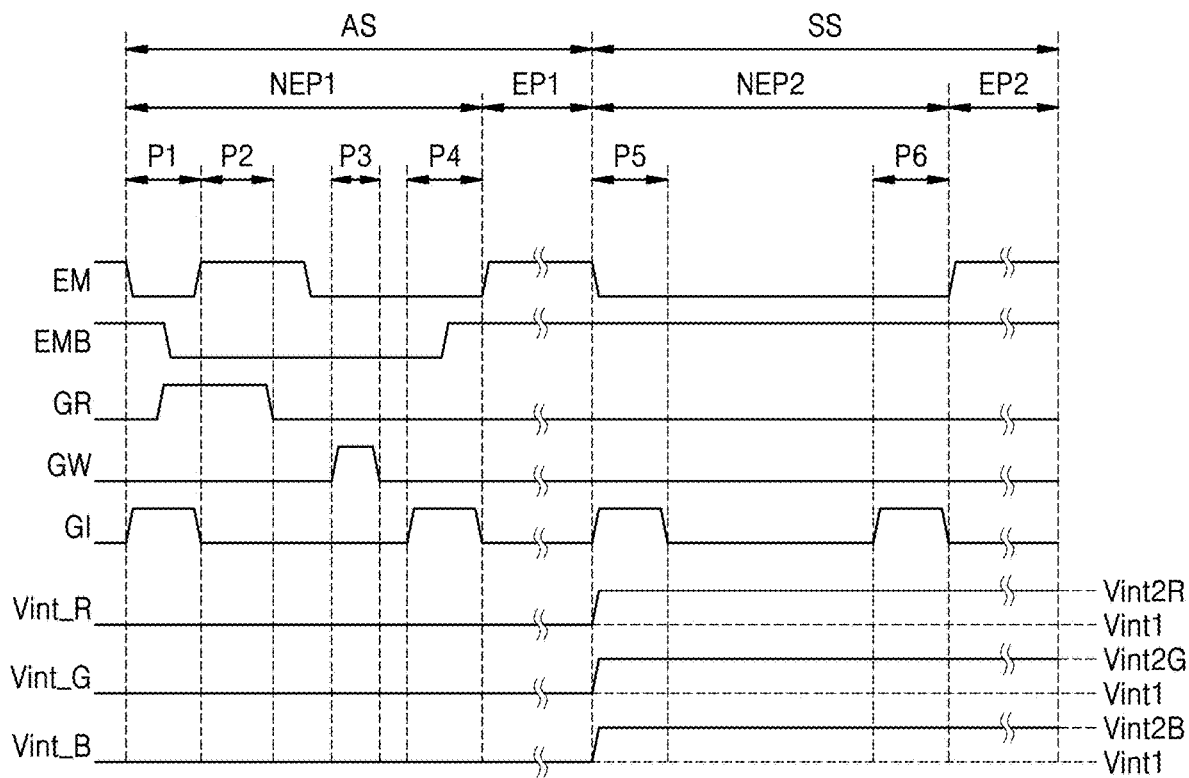
FIGS. 12 through 15 are views schematically illustrating signals for describing an operation of the pixel shown in FIG. 4, according to an embodiment.

The signals shown in FIG. 12 may be substantially the same as or similar to the signals shown in FIG. 8, except for the initialization voltage Vint for each pixel.

The plurality of pixels PX arranged in the display area DA may include a first pixel PX1 emitting light in a first color, a second pixel PX2 emitting light in a second color, and a third pixel PX3 emitting light in a third color. For example, the first pixel PX1 may be a red pixel, the second pixel PX2 may be a green pixel, and the third pixel PX3 may be a blue pixel. The first pixel PX1, the second pixel PX2, and the third pixel PX3 may be repeatedly arranged according to certain patterns in the x direction and the y direction. Each of the first pixel PX1, the second pixel PX2, and the third pixel PX3 may include a pixel circuit PC shown in FIG. 4 and an organic light-emitting diode OLED as a display element electrically connected to the pixel circuit PC.

In an embodiment, different second initialization voltages Vint_R, Vint_G, and Vint_B may be supplied to the first pixel PX1, the second pixel PX2, and the third pixel PX3, respectively, considering emission characteristics of the first pixel PX1, the second pixel PX2, and the third pixel PX3. For example, the pixel circuit PC of the first pixel PX1 may be electrically connected to a first initialization voltage line, and the pixel circuit PC of the second pixel PX2 may be electrically connected to a second initialization voltage line, and the pixel circuit PC of the third pixel PX3 may be electrically connected to a third initialization voltage line. As shown in FIG. 12, from a start time point of the second scan period SS, for example, a start time point of the fifth period P5, a (2-1)-th initialization voltage Vint2R may be supplied to the first initialization voltage line, and a (2-2)-th initialization voltage Vint2G may be supplied to the second initialization voltage line, and a (2-3)-th initialization voltage Vint2B may be supplied to the third initialization voltage line.

Figure 13:
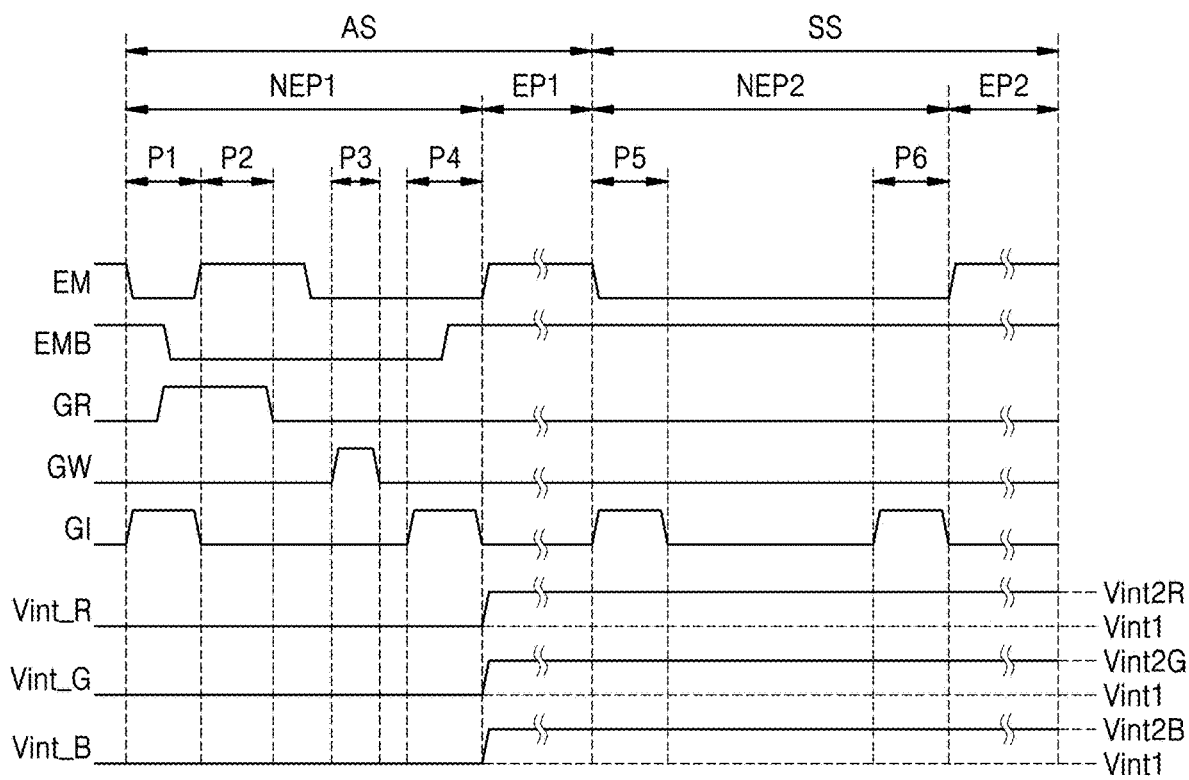

The signals shown in FIG. 13 may be substantially the same as or similar to the signals shown in FIG. 12, except for supply time point of the initialization voltage Vint for each pixel. Referring to FIG. 13, from a start time point of a first emission period EP1, a (2-1)-th initialization voltage Vint2R may be supplied to a first initialization voltage line, and a (2-2)-th initialization voltage Vint2G may be supplied to a second initialization voltage line, and a (2-3)-th initialization voltage Vint2B may be supplied to a third initialization voltage line.

Figure 14:
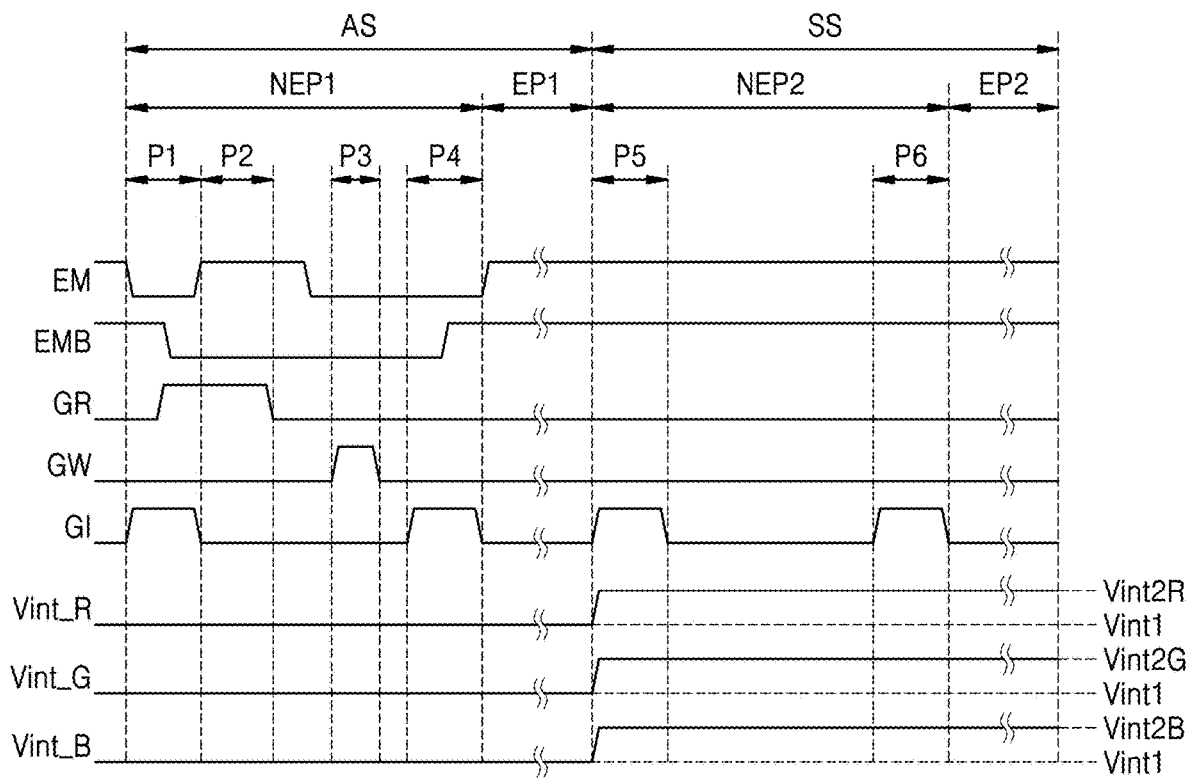

The signals shown in FIG. 14 may be substantially the same as or similar to the signals shown in FIG. 12, except for a voltage level of the fourth gate voltage EM. Referring to FIG. 14, the gate driving circuit 13 may output a fourth gate voltage EM of a gate-off voltage during a first period P1, a third period P3, and a fourth period P4 of a first scan period AS, and may output a fourth gate voltage EM of a gate-on voltage during remaining periods of the first scan period AS and a second scan period SS. The gate driving circuit 13 may output a fifth gate voltage EMB of a gate-on voltage in the first emission period EP1 of the first scan period AS and the second scan period SS. In the second scan period SS, a fourth gate signal EM of a gate-on voltage may be supplied to the fourth gate line EML, and a fifth gate signal EMB of a gate-on voltage may be supplied to the fifth gate line EMBL.

From a start time point of the second scan period SS, i.e., a start time point of the fifth period P5, the (2-1)-th initialization voltage Vint2R may be supplied to the first initialization voltage line, and the (2-2)-th initialization voltage Vint2G may be supplied to a second initialization voltage line, and the (2-3)-th initialization voltage Vint2B may be supplied to the third initialization voltage line.

Figure 15:
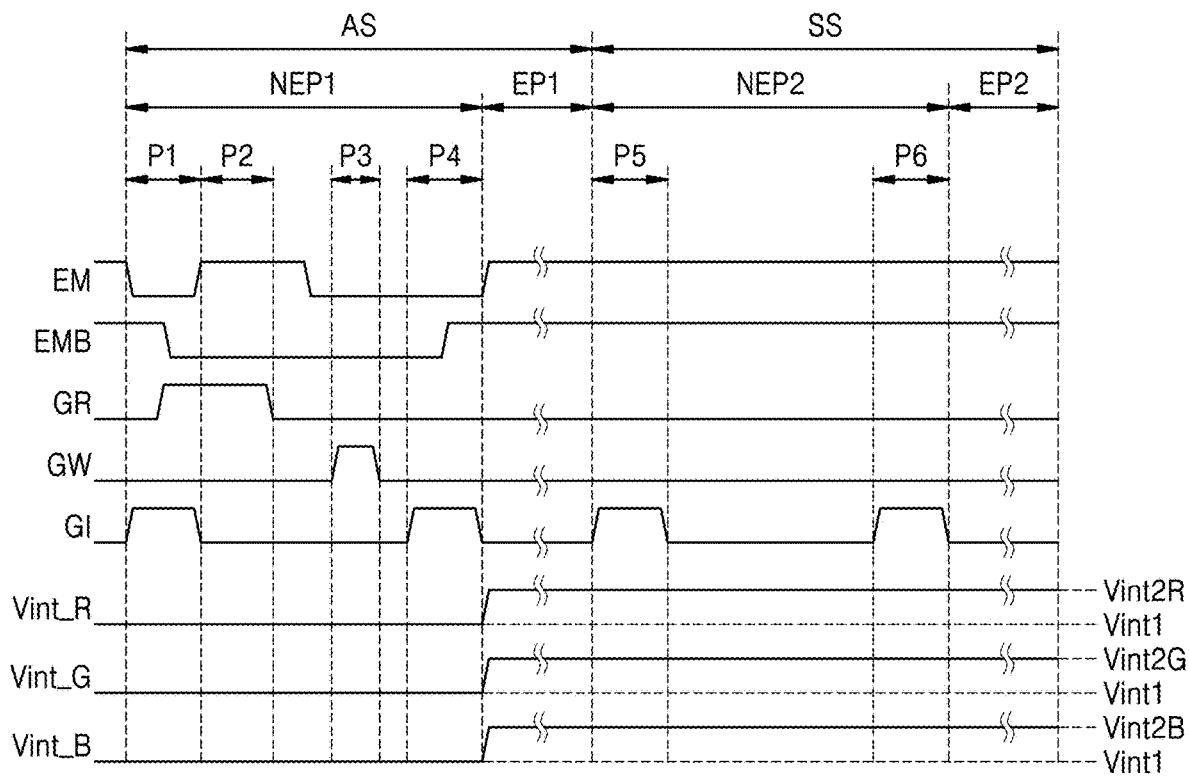

The signals shown in FIG. 15 may be substantially the same as or similar to the signals shown in FIG. 14, except for supply time point of the initialization voltage Vint for each pixel. Referring to FIG. 15, from a start time point of a first emission period EP1, the (2-1)-th initialization voltage Vint2R may be supplied to a first initialization voltage line, and the (2-2)-th initialization voltage Vint2G may be supplied to a second initialization voltage line, and the (2-3)-th initialization voltage Vint2B may be supplied to a third initialization voltage line.

In the embodiments illustrated in FIGS. 12 through 15, different second initialization voltages may be supplied to each of the first pixel PX1, the second pixel PX2, and the third pixel PX3, but embodiments of the inventive concept are not limited thereto. In an embodiment, a second initialization voltage supplied to at least one of the first pixel PX1, the second pixel PX2, and the third pixel PX3 may be different from a second initialization voltage supplied to the remaining pixels. For example, the same second initialization voltage may be supplied to the second pixel PX2 and the third pixel PX3, and the second initialization voltage supplied to the first pixel PX1 and the second initialization voltage supplied to the second pixel PX2 and the third pixel PX3 may be different.

Figure 16:
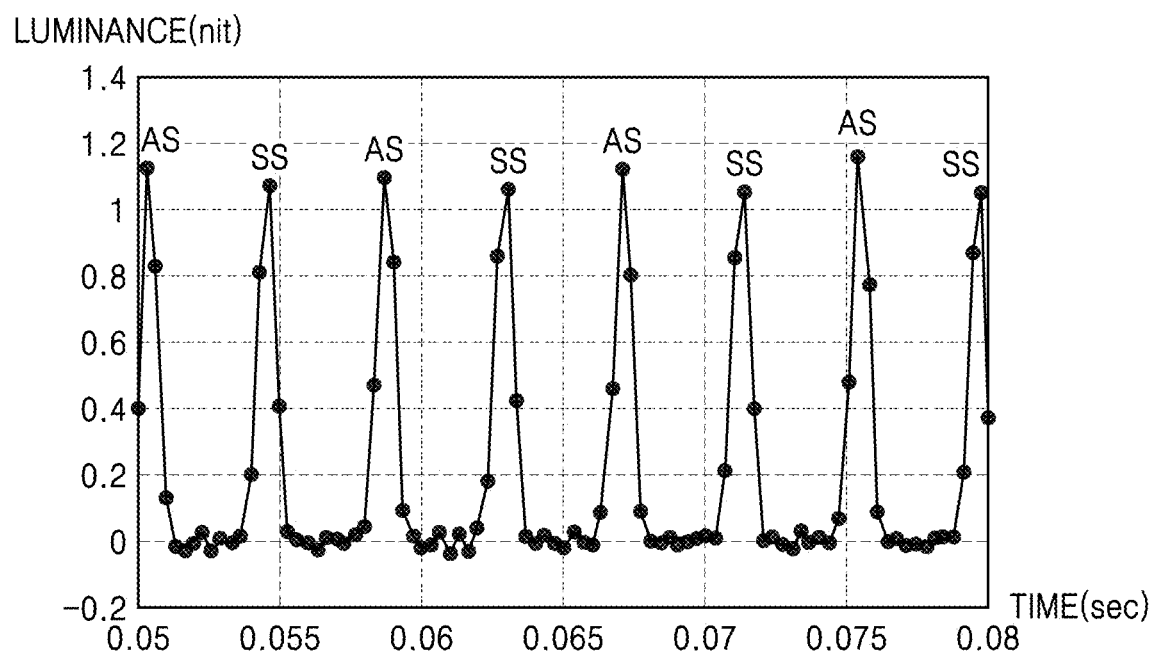
FIG. 16 is a view illustrating luminance of a display apparatus according to embodiments of FIGS. 8 through 15.

FIG. 16 is a view illustrating luminance of a display apparatus according to embodiments of FIGS. 8 through 15. As shown in FIG. 16, the luminance of the display apparatus in the first emission period EP1 of the first scan period AS and the luminance of the display device in the second emission period EP2 of the second scan period SS may be approximately similar.

Figure 17:
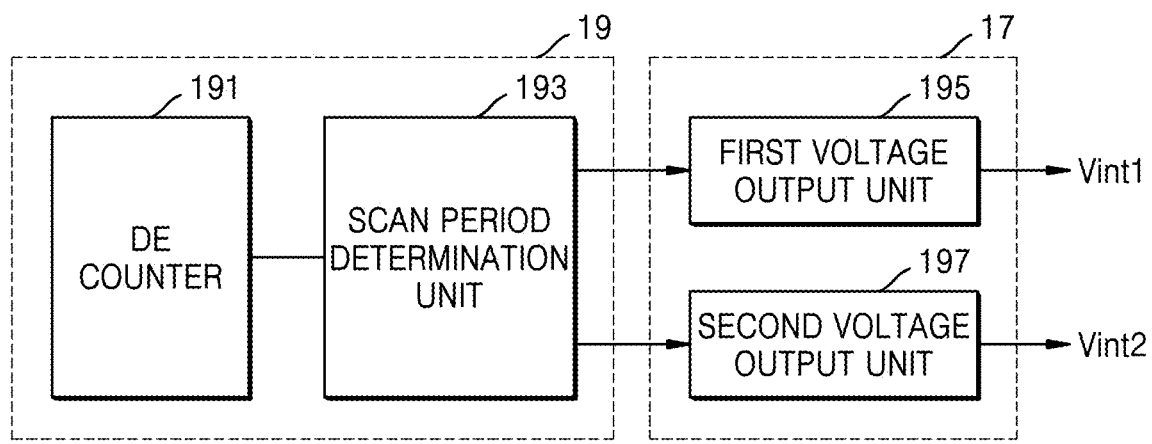
FIG. 17 is a view for describing output of an initialization voltage according to an embodiment.

FIG. 17 is a view for describing output of an initialization voltage according to an embodiment.

Referring to FIG. 17, a display apparatus 1 may include a data enable (DE) counter 191, a scan period determination part 193, a first voltage output part 195, and a second voltage output part 197.

The DE counter 191 may count a data enable signal (DE of FIG. 2) output to a data driving circuit 15 from the controller 19. A first gate signal GW may be sequentially applied to the first gate lines GWL from the first row (pixel line) to the last row in the third period P3 of each frame, and the data signals Vdata may be supplied to the pixels PX in response to the data enable signal DE.

The scan period determination part 193 may determine a first scan period AS and a second scan period SS on the basis of the count value of the DE counter 191. The scan period determination part 193 may output a control signal including information on a change time point of the initialization voltage based on the frame frequency of the display apparatus and the count value of the data enable signal DE. In an embodiment, the control signal PCS output by the controller 19 may include information about a change time point of the initialization voltage. The change time point of the initialization voltage may be set as an arbitrary time point of the period from the fourth period P4 of the first scan period AS to the start time point of the second scan period SS. For example, the change time point of the initialization voltage may be a start time point of the second scan period SS or a start time point of the fifth period S5. As another example, the change time point of the initialization voltage may be prior to a start time point of the second scan period SS or a start time point of the fifth period S5. For example, the change time point of the initialization voltage may be a start time point of the first emission period EP1 of the first scan period AS.

According to the control signal of the scan period determination part 193, the first voltage output part 195 may output a first initialization voltage Vint1, and the second voltage output part 197 may output a second initialization voltage Vint2. In an embodiment, the first voltage output part 195 and the second voltage output part 197 may be individually embodied in different integrated circuits or may be implemented together in the same integrated circuit.

In the embodiment shown in FIG. 17, the DE counter 191 and the scan period determination part 193 may be included in the controller 19, and the first voltage output part 195 and the second voltage output part 197 may be included in the power supply circuit 17. In an embodiment, the DE counter 191 and the scan period determination part 193 may also be included in the power supply circuit 17.

Figure 18:
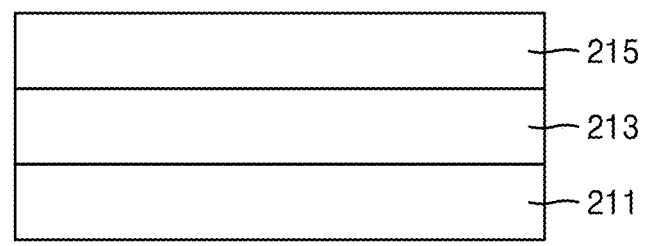
FIG. 18 is a schematic cross-sectional view illustrating a structure of a display element according to an embodiment.

FIG. 18 is a schematic cross-sectional view illustrating a structure of a display element according to an embodiment. FIGS. 19A through 21 are schematic cross-sectional views illustrating a structure of a display element according to an embodiment.

Referring to FIG. 18, an organic light-emitting diode OLED as a display element according to an embodiment may include a pixel electrode 211, an opposite electrode 215, and an intermediate layer 213 between the pixel electrode 211 (first electrode, anode) and the opposite electrode 215 (second electrode, cathode).

The pixel electrode 211 may include a transparent conductive oxide such as indium tin oxide (ITO), indium zinc oxide (IZO), zinc oxide (ZnO), indium oxide ($In_2O_3$), indium gallium oxide (IGO), or aluminum zinc oxide (AZO), or a combination thereof. The pixel electrode 211 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a combination thereof. For example, the pixel electrode 211 may have a three-layer structure of ITO/Ag/ITO.

The opposite electrode 215 may be disposed on the intermediate layer 213. The opposite electrode 215 may include metal having a small work function, an alloy, an electrical conductive compound, or any combination thereof. For example, the opposite electrode 215 may include lithium (Li), Ag, Mg, Al, Al—Li, calcium (Ca), Mg—In, Mg—Ag, ytterbium (Yb), Ag—Yb, ITO, IZO, or any combination thereof. The opposite electrode 215 may be a transmissive electrode, a semi-transmissive electrode, or a reflective electrode, or a combination thereof.

The intermediate layer 213 may include a polymer or a low molecular weight organic material emitting light of a certain color. The intermediate layer 213 may further include, in addition to various organic materials, a metal-containing compound such as an organometallic compound, an inorganic material such as a quantum dot, and the like, or a combination thereof.

In an embodiment, the intermediate layer 213 may include one emission layer and a first functional layer and a second functional layer respectively below or above the emission layer. The first functional layer may include, for example, a hole transport layer (HTL) or a HTL and a hole injection layer (HIL). The second functional layer may include an electron transport layer (ETL) and/or an electron injection layer (EIL). The first functional layer or the second functional layer may be omitted. The first functional layer and the second functional layer may be integral with each other to correspond to organic light-emitting diodes OLED included in the display area DA.

In one embodiment, the intermediate layer 213 may include two or more emitting units sequentially stacked each other between the pixel electrode 211 and the opposite electrode 215, and a charge generation layer CGL disposed between the two emitting units. In case that the intermediate layer 213 includes an emitting part and a CGL, the organic light-emitting diode OLED may be a tandem light-emitting device. The organic light-emitting diode OLED may have a stack structure of emitting units, thereby enhancing color purity and emission efficiency.

One emitting part may include an emission layer and a first functional layer and a second functional layer respectively below and above the emission layer. The charge generation layer CGL may include a negative charge generation layer CGL and a positive charge generation layer CGL. The emission efficiency of the organic light-emitting diode OLED, which may be a tandem light-emitting device having emission layers by the negative charge generation layer CGL and the positive charge generation layer CGL, may be further increased.

The negative charge generation layer CGL may be an n-type charge generation layer CGL. The negative charge generation layer CGL may supply electrons. The negative charge generation layer CGL may include a host and a dopant. The host may include an organic material. The dopant may include a metal material. The positive charge generation layer CGL may be a p-type charge generation layer CGL. The positive charge generation layer CGL may supply holes. The positive charge generation layer CGL may include a host and a dopant. The host may include an organic material. The dopant may include a metal material.

Figure 19A:
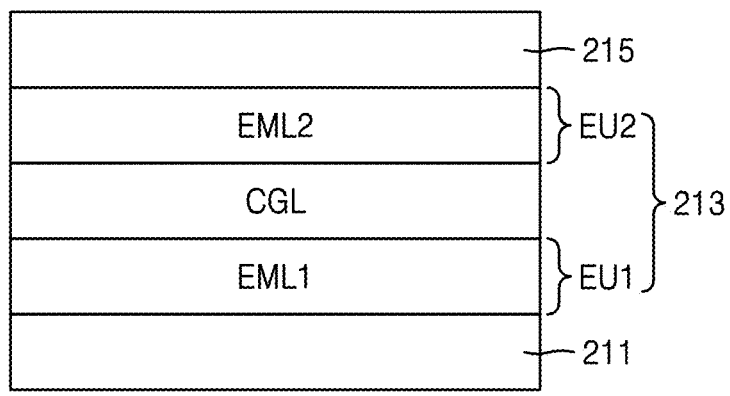
FIGS. 19A through 21 are schematic cross-sectional views illustrating a structure of a display element according to an embodiment.

In an embodiment, as shown in FIG. 19A, the organic light-emitting diode OLED may include a first emitting part EU1 including a first emission layer EML1 and a second emitting part EU2 including a second emission layer EML2 that may be sequentially stacked each other. A charge generation layer CGL may be provided between the first emitting part EU1 and the second emitting part EU2. For example, the organic light-emitting diode OLED may include a pixel electrode 211, a first emission layer EML1, a charge generation layer CGL, a second emission layer EML2, and an opposite electrode 215. A first functional layer and a second functional layer may be included below and below the first emission layer EML1. A first functional layer and a second functional layer may be included below and below the second emission layer EML2. The first emission layer EML1 may be a blue emission layer, and the second emission layer EML2 may be a yellow emission layer.

Figure 19B:
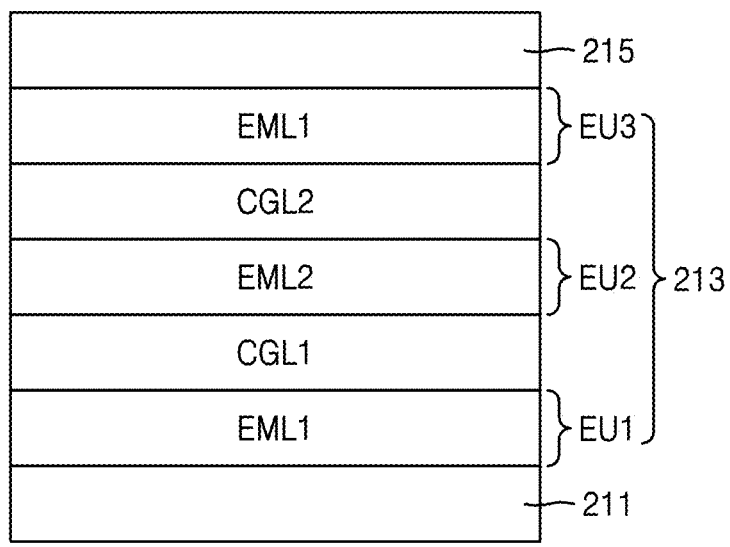

In an embodiment, as shown in FIG. 19B, the organic light-emitting diode OLED may include a first emitting part EU1 and a third emitting part EU3 including a first emission layer EML1, and a second emitting part EU2 including a second emission layer EML2. A first charge generation layer CGL1 may be provided between the first emitting part EU1 and the second emitting part EU2, and a second charge generation layer CGL2 may be provided between the second emitting part EU2 and the third emitting part EU3. For example, the organic light-emitting diode OLED may include a pixel electrode 211, a first emission layer EML1, a first charge generation layer CGL1, a second emission layer EML2, a second charge generation layer CGL2, a first emission layer EML1, and an opposite electrode 215 that may be sequentially stacked each other. A first functional layer and a second functional layer may be included below and below the first emission layer EML1. A first functional layer and a second functional layer may be included below and below the second emission layer EML2. The first emission layer EML1 may be a blue emission layer, and the second emission layer EML2 may be a yellow emission layer.

In an embodiment, the organic light-emitting diode OLED may further include a third emission layer EML3 and/or a fourth emission layer EML4 in which the second emitting part EU2 may be in contact with (e.g., directly in contact with) below and/or above the second emission layer EML2, in addition to the second emission layer EML2. Here, directly contact may mean that another layer is not disposed between the second emission layer EML2 and the third emission layer EML3 and/or between the second emission layer EML2 and the fourth emission layer EML4. The third emission layer EML3 may be a red emission layer, and the fourth emission layer EML4 may be a green emission layer.

Figure 19C:
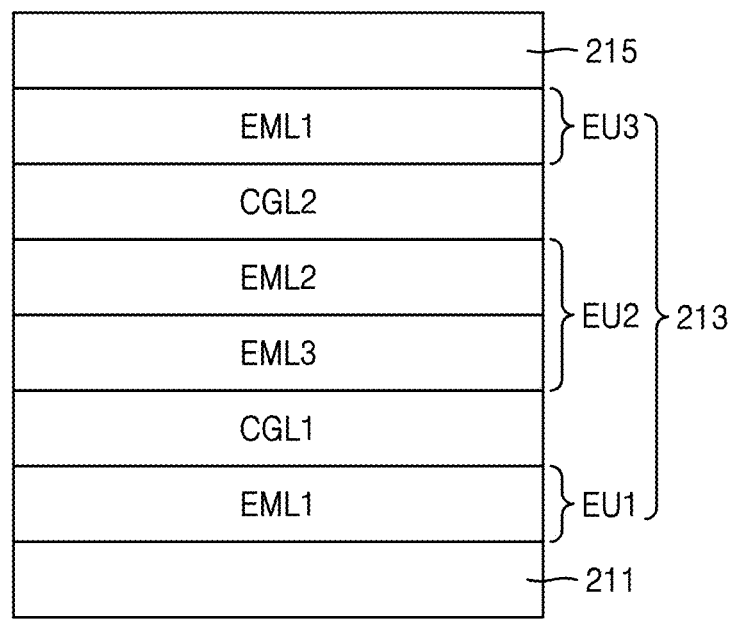

For example, as shown in FIG. 19C, the organic light-emitting diode OLED may include a pixel electrode 211, a first emission layer EML1, a first charge generation layer CGL1, a third emission layer EML3, a second emission layer EML2, a second charge generation layer CGL2, a first emission layer EML1, and an opposite electrode 215 that may be sequentially stacked each other. In another example shown in FIG. 19D, the organic light-emitting diode OLED may include a pixel electrode 211, a first emission layer EML1, a first charge generation layer CGL1, a third emission layer EML3, a second emission layer EML2, a fourth emission layer EML4, a second charge generation layer CGL2, a first emission layer EML1, and an opposite electrode 215 that may be sequentially stacked each other.

Figure 19D:
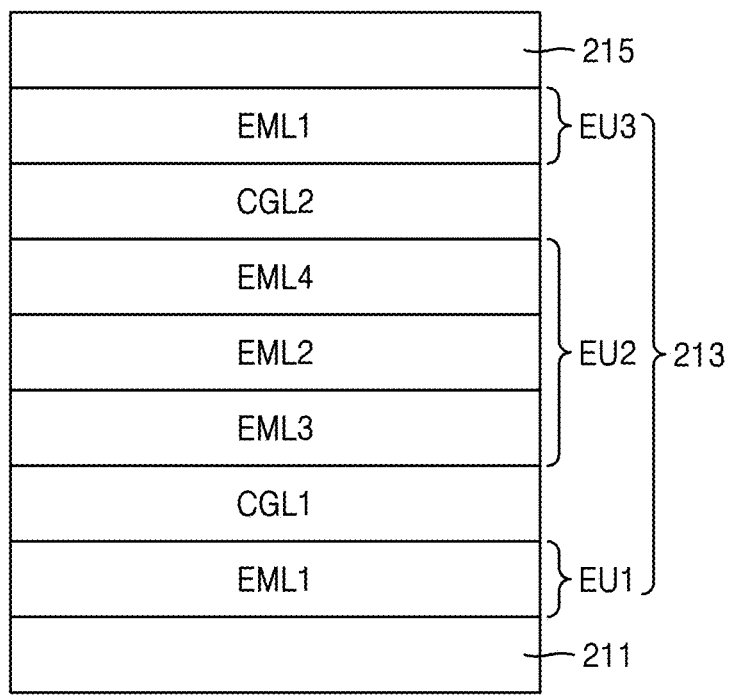
Figure 20A:
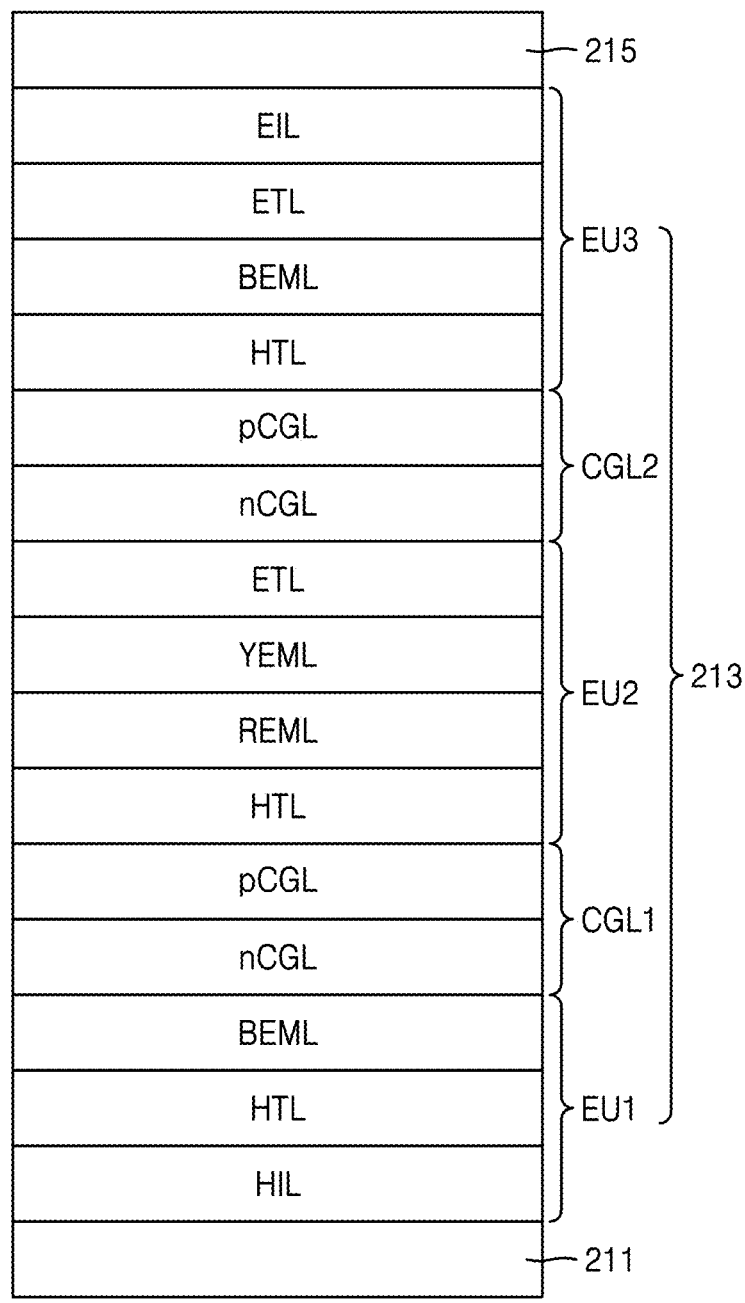
Figure 20B:
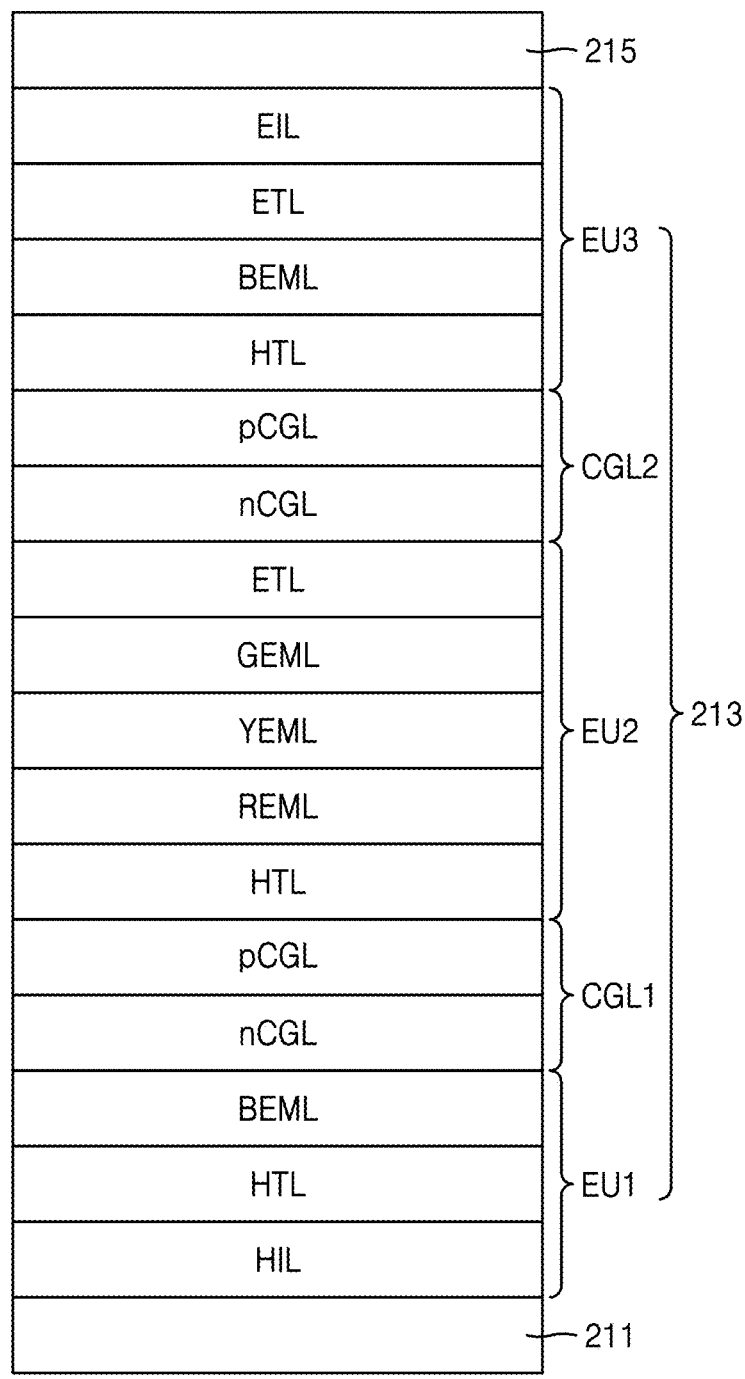

FIG. 20A is a schematic cross-sectional view illustrating an example of the organic light-emitting diode of FIG. 19C, and FIG. 20B is a schematic cross-sectional view illustrating an example of the organic light-emitting diode of FIG. 19D.

Referring to FIG. 20A, the organic light-emitting diode OLED may include a first emitting part EU1, a second emitting part EU2, and a third emitting part EU3 that may be sequentially stacked each other. A first charge generation layer CGL1 may be provided between the first emitting part EU1 and the second emitting part EU2, and a second charge generation layer CGL2 may be provided between the second emitting part EU2 and the third emitting part EU3. Each of the first charge generation layer CGL1 and the second charge generation layer CGL2 may include a negative charge generation layer nCGL and a positive charge generation layer pCGL.

The first emitting part EU1 may include a blue emission layer BEML. The first emitting part EU1 may further include a HIL and a HTL between the pixel electrode 211 and the blue emission layer BEML. In an embodiment, a p-doping layer may be further included between the HIL and the HTL. The p-doping layer may be formed by doping the HIL with a p-type doping material. In an embodiment, at least one of a blue light auxiliary layer, an electron blocking layer, and a buffer layer may be further included between the blue emission layer BEML and the HTL. A blue light auxiliary layer may increase light emission efficiency of the blue emission layer BEML. The blue light auxiliary layer may adjust a hole charge balance to increase light emission efficiency of the blue emission layer BEML. The electron blocking layer may prevent electron injection into the HTL. The buffer layer may compensate for a resonance distance according to the wavelength of light emitted from the emission layer.

The second emitting part EU2 may include a yellow emission layer YEML and a red emission layer REML in contact with (e.g., directly in contact with) the yellow emission layer YEML below the yellow emission layer YEML. The second emitting part EU2 may further include a HTL between the positive charge generation layer pCGL of the first charge generation layer CGL1 and the red emission layer REML and may further include an electron transport layer (ETL) between the yellow emission layer YEML and the second charge generation layer CGL2.

The third emitting part EU3 may include a blue emission layer BEML. The third emitting part EU3 may further include a HTL between the positive charge generation layer pCGL of the second charge generation layer CGL2 and the blue emission layer BEML. The third emitting part EU3 may further include an electron transport layer (ETL) and an electron injection layer (EIL) between the blue emission layer BEML and the opposite electrode 215. The ETL may be a single layer or multiple layers. In an embodiment, at least one of a blue light auxiliary layer, an electron blocking layer, and a buffer layer may be further included between the blue emission layer BEML and the HTL. At least one of a hole blocking layer and a buffer layer may be further included between the blue emission layer BEML and the ETL. The hole blocking layer may prevent electron injection into the HTL.

The organic light-emitting diode OLED shown in FIG. 20B is different from the organic light-emitting diode OLED illustrated in FIG. 20A, in which a stacked structure of the second emitting part EU2 is different from that of the organic light-emitting diode OLED shown in FIG. 20A. Referring to FIG. 2B, the second emitting part EU2 may include a yellow emission layer YEML, a red emission layer REML in contact with (e.g., directly in contact with) the yellow emission layer YEML below the yellow emission layer YEML, and a green emission layer GEML in contact with (e.g., directly in contact with) the yellow emission layer YEML above the yellow emission layer YEML. The second emitting part EU2 may further include a HTL between the positive charge generation layer pCGL of the first charge generation layer CGL1 and the red emission layer REML and may further include an ETL between the green emission layer GEML and the negative charge generation layer nCGL of the second charge generation layer CGL2.

Figure 21:
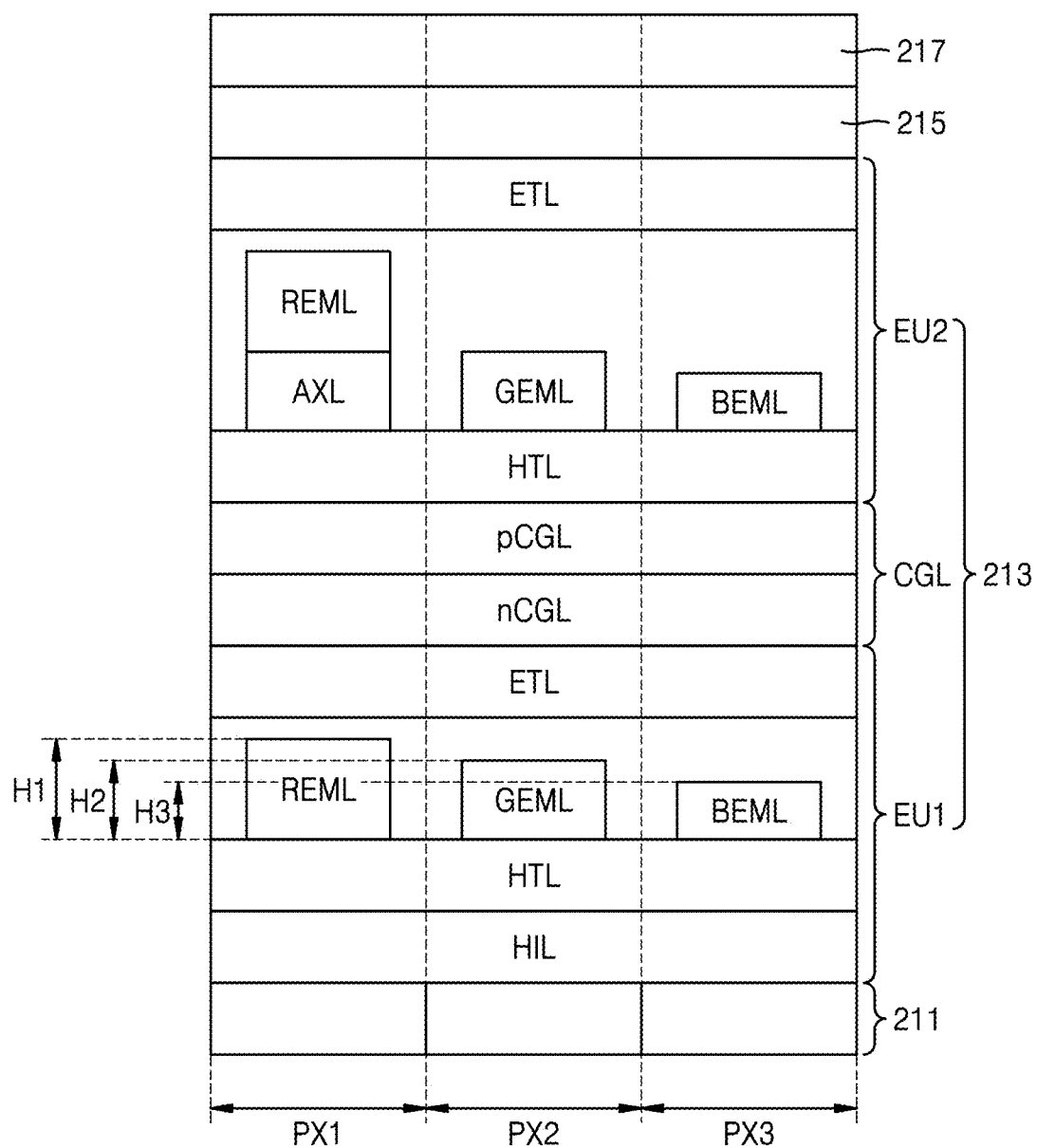

FIG. 21 is a schematic cross-sectional view illustrating a structure of a pixel of a display apparatus according to an embodiment.

Referring to FIG. 21, the display apparatus may include pixels. The plurality of pixels may include a first pixel PX1, a second pixel PX2, and a third pixel PX3. The first pixel PX1, the second pixel PX2, and the third pixel PX3 may include a pixel electrode 211, an opposite electrode 215, and an intermediate layer 213. In an embodiment, the first pixel PX1 may be a red pixel, the second pixel PX2 may be a green pixel, and the third pixel PX3 may be a blue pixel. Here, the pixel may include an organic light-emitting diode OLED as a display element, and the organic light-emitting diode OLED of each pixel may be electrically connected to a pixel circuit.

The pixel electrode 211 may be independently provided in each of the first pixel PX1, the second pixel PX2, and the third pixel PX3.

The intermediate layer 213 of the organic light-emitting diode OLED of each of the first pixel PX1, the second pixel PX2, and the third pixel PX3 may include a first emitting part EU1 and a second emitting part EU2, and a charge generation layer CGL between the first emitting part EU1 and the second emitting part EU2, which may be sequentially stacked each other. The charge generation layer CGL may include a negative charge generation layer nCGL and a positive charge generation layer pCGL. The charge generation layer CGL may be a common layer continuously formed in the first pixel PX1, the second pixel PX2, and the third pixel PX3.

The first emitting part EU1 of the first pixel PX1 may include an HIL, an HTL, a red emission layer REML, and an ETL, which may be sequentially stacked each other on the pixel electrode 211. The first emitting part EU1 of the second pixel PX2 may include an HIL, an HTL, a green emission layer GEML, and an ETL, which may be sequentially stacked each other on the pixel electrode 211. The first emitting part EU1 of the third pixel PX3 may include an HIL, an HTL, a blue emission layer BEML, and an ETL, which may be sequentially stacked each other on the pixel electrode 211. Each of the HIL, the HTL, and the ETL of the first emitting units EU1 may be a common layer continuously formed in the first pixel PX1, the second pixel PX2, and the third pixel PX3.

The second emitting part EU2 of the first pixel PX1 may include an HTL, an auxiliary layer AXL, a red emission layer REML, and an ETL, which may be sequentially stacked each other on the charge generation layer CGL. The second emitting part EU2 of the second pixel PX2 may include an HTL, a green emission layer GEML, and an ETL, which may be sequentially stacked each other on the CGL. The second emitting part EU2 of the third pixel PX3 may include an HTL, a blue emission layer BEML, and an ETL, which may be sequentially stacked each other on the charge generation layer CGL. Each of the HIL and the HTL of the second emitting units EU1 may be a common layer continuously formed in the first pixel PX1, the second pixel PX2, and the third pixel PX3. In an embodiment, at least one of a hole blocking layer and a buffer layer may be further included between the emission layer and the ETL in the second emitting part EU2 of the first pixel PX1, the second pixel PX2, and the third pixel PX3.

A thickness H1 of the red emission layer REML, a thickness H2 of the green emission layer GEML, and a thickness H3 of the blue emission layer BEML may be determined according to the resonance distance. The auxiliary layer AXL is an added layer for matching a resonance distance, and may include a resonance assistance material. For example, the auxiliary layer AXL and the HTL may include a same material.

In FIG. 21, an auxiliary layer AXL is provided only in the first pixel PX1, but the embodiment of the disclosure is not limited thereto. For example, the auxiliary layer AXL may be provided on at least one of the first pixel PX1, the second pixel PX2, and the third pixel PX3 so as to match a resonance distance between the first pixel PX1, the second pixel PX2, and the third pixel PX3.

The display apparatus may further include a capping layer 217 disposed outside the opposite electrode 215. The capping layer 217 may enhance the emission efficiency based on the principle of constructive interference. Thus, the light extraction efficiency of the organic light-emitting diode OLED may be increased, and thus the emission efficiency of the organic light-emitting diode OLED may be enhanced.

According to one or more embodiments, a display apparatus having improved display quality may be provided. Of course, the scope of the disclosure is not limited by these effects. Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display apparatus, comprising,
   a plurality of pixels, each pixel of the plurality of pixels comprising,
   a light-emitting diode;
   a first transistor electrically connected to a driving voltage line and the light-emitting diode;
   a second transistor electrically connected to the first transistor and the light-emitting diode; and
   a third transistor electrically connected to the light-emitting diode and an initialization voltage line, wherein
   during a frame, the each pixel is configured to operate by receiving a data signal in a writing period and emitting light with luminance corresponding to the data signal in a first emission period in a first scan period, and maintaining the data signal and emitting light with luminance corresponding to the maintained data signal in a second emission period in a second scan period, and
   the initialization voltage line is configured to receive a first initialization voltage in at least the first scan period and to receive a second initialization voltage different from the first initialization voltage in at least the second scan period.

2. The display apparatus of claim 1, wherein a gate of the second transistor is configured to receive a first gate signal of a gate-on voltage during the second scan period.

3. The display apparatus of claim 1, wherein, in the second scan period, a gate of the third transistor is configured to receive a second gate signal of a gate-on voltage twice before the second emission period.

4. The display apparatus of claim 1, wherein the initialization voltage line is configured to receive the second initialization voltage from a start time point of the second scan period.

5. The display apparatus of claim 1, wherein the initialization voltage line is configured to receive the second initialization voltage in the first emission period of the first scan period and the second scan period.

6. The display apparatus of claim 1, wherein a voltage level of the second initialization voltage is higher than a voltage level of the first initialization voltage.

7. The display apparatus of claim 1, wherein a gate of the second transistor is configured to receive a first gate signal of a gate-on voltage and a gate of the third transistor is configured to receive a second gate signal of a gate-on voltage in a period between the writing period and the first emission period.

8. The display apparatus of claim 1, wherein
   the each pixel further comprises a fourth transistor electrically connected to a data line and a gate of the first transistor, and
   a gate of the fourth transistor is configured to receive a third gate signal of a gate-on voltage in the writing period.

9. The display apparatus of claim 7, wherein the each pixel further comprises:

a fifth transistor electrically connected to the driving voltage line and the first transistor; and a sixth transistor electrically connected to the gate of the first transistor and a reference voltage line, wherein the gate of the second transistor is configured to receive a first gate signal of a gate-off voltage, a gate of the fifth transistor is configured to receive a fourth gate signal of a gate-on voltage, and a gate of the sixth transistor is configured to receive a fifth gate signal of a gate-on voltage in a period before the writing period of the first scan period.

10. The display apparatus of claim 9, wherein the gate of the fifth transistor is configured to receive the fourth gate signal of the gate-on voltage during the first emission period and the second emission period.

11. The display apparatus of claim 10, wherein the gate of the fifth transistor is configured to receive the fourth gate signal of the gate-on voltage during the second scan period including the second emission period.

12. The display apparatus of claim 5, wherein
the plurality of pixels comprise a first pixel emitting light of a first color and a second pixel emitting light of a second color, and
a second initialization voltage supplied to the first pixel and a second initialization voltage supplied to the second pixel are different from each other.

13. The display apparatus of claim 1, further comprising a power supply circuit configured to output the first initialization voltage to the plurality of pixels in the first scan period and to output the second initialization voltage in the second scan period.

14. An electronic apparatus comprising:
a display panel including a plurality of pixels arranged in a display area; and
a power supply circuit, wherein
each pixel of the plurality of pixels comprises,
a light-emitting diode;
a first transistor electrically connected to a driving voltage line and the light-emitting diode;
a second transistor electrically connected to the first transistor and the light-emitting diode; and
a third transistor electrically connected to the light-emitting diode and an initialization voltage line,
during a frame, the each pixel is configured to operate by receiving a data signal in a writing period and emitting light with luminance corresponding to the data signal in a first emission period in a first scan period, and maintaining the data signal and emitting light with luminance corresponding to the maintained data signal in a second emission period in a second scan period, and
the power supply circuit is configured to output a first initialization voltage in at least the first scan period and to output a second initialization voltage different from the first initialization voltage in at least the second scan period to the initialization voltage line.

15. The electronic apparatus of claim 14, wherein the power supply circuit is configured to output the second initialization voltage to the initialization voltage line from a start time point of the second scan period.

16. The electronic apparatus of claim 14, wherein the power supply circuit is configured to output the second initialization voltage to the initialization voltage line in the first emission period of the first scan period and the second scan period.

17. The electronic apparatus of claim 14, wherein a voltage level of the second initialization voltage is higher than a voltage level of the first initialization voltage.

18. The electronic apparatus of claim 14, further comprising:
a gate driving circuit in a peripheral area of the display panel and configured to output at least one gate signals to the plurality of pixels, wherein
the each pixel further comprises:
a fourth transistor electrically connected to a data line and a gate of the first transistor;
a fifth transistor electrically connected to the driving voltage line and the first transistor; and
a sixth transistor electrically connected to the gate of the first transistor and a reference voltage line,
the gate driving circuit is configured to output a first gate signal of a gate-on voltage to a gate of the second transistor during the second scan period,
the gate driving circuit is configured to output a second gate signal of a gate-on voltage to a gate of the third transistor in a period between the writing period and the first emission period in the first scan period, and twice before the second emission period in the second scan period,
the gate driving circuit is configured to output a third gate signal of a gate-on voltage to a gate of the fourth transistor in the writing period, and
the gate driving circuit is configured to output a first gate signal of a gate-off voltage to the gate of the second transistor, a fourth gate signal of a gate-on voltage to a gate of the fifth transistor, and a fifth gate signal of a gate-on voltage to a gate of the sixth transistor, in a period before the writing period of the first scan period.

19. The electronic apparatus of claim 18, wherein the gate driving circuit is configured to output the fourth gate signal of the gate-on voltage to the gate of the fifth transistor in the first emission period and the second emission period.

20. The electronic apparatus of claim 14, wherein
the plurality of pixels comprise a first pixel emitting light of a first color and a second pixel emitting light of a second color, and
a second initialization voltage supplied to the first pixel and a second initialization voltage supplied to the second pixel are different from each other.

* * * * *